(12) United States Patent
Zong

(10) Patent No.: US 11,646,182 B2
(45) Date of Patent: May 9, 2023

(54) COATING APPARATUS AND COATING METHOD

(71) Applicant: JIANGSU FAVORED NANOTECHNOLOGY CO., LTD., Wuxi (CN)

(72) Inventor: Jian Zong, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 246 days.

(21) Appl. No.: 16/940,354

(22) Filed: Jul. 27, 2020

(65) Prior Publication Data

US 2021/0287870 A1    Sep. 16, 2021

Related U.S. Application Data

(63) Continuation-in-part of application No. 16/814,967, filed on Mar. 10, 2020.

(30) Foreign Application Priority Data

Dec. 18, 2019 (CN) .......................... 201911310683.X

(51) Int. Cl.
| | |
|---|---|
| H01J 37/32 | (2006.01) |
| C23C 16/458 | (2006.01) |
| C23C 16/50 | (2006.01) |

(52) U.S. Cl.
CPC .... H01J 37/32779 (2013.01); C23C 16/4584 (2013.01); C23C 16/4588 (2013.01);
(Continued)

(58) Field of Classification Search
CPC .......... H01J 37/32779; H01J 37/32449; H01J 37/32559; H01J 37/32715;
(Continued)

(56) References Cited

U.S. PATENT DOCUMENTS

| | | | | |
|---|---|---|---|---|
| 5,355,832 A | * | 10/1994 | Loh ...................... | C23C 16/0245 118/723 MW |
| 5,370,737 A | * | 12/1994 | Mathis .................. | C23C 14/505 156/345.43 |
| 2005/0229852 A1 | * | 10/2005 | Fanfani ................... | C23C 16/50 118/723 E |

FOREIGN PATENT DOCUMENTS

| | | | | |
|---|---|---|---|---|
| JP | 11131241 A | * | 5/1999 | |
| JP | 2009123513 A | * | 6/2009 | ........... C23C 16/503 |

OTHER PUBLICATIONS

English Machine Translation of Murakami (JPH11131241A) retrieved from ESPACNET on Oct. 7, 2022 (Year: 2022).*

(Continued)

*Primary Examiner* — Ram N Kackar
*Assistant Examiner* — Laureen Chan
(74) *Attorney, Agent, or Firm* — Parker Highlander PLLC

(57) ABSTRACT

A coating apparatus for coating a plurality of substrates includes a chamber body having a reaction chamber, a monomer discharge source having a discharge inlet for introducing a coating forming material into the reaction chamber of the chamber body, and a plasma generation source disposed at a central area of the reaction chamber of the chamber body for exciting the coating forming material, wherein the plurality of substrates is adapted for being arranged around the plasma generation source within the chamber body, so that the uniformity of the coatings formed on the surfaces of the substrates is enhanced, and the deposition velocity is increased.

14 Claims, 14 Drawing Sheets

(52) U.S. Cl.
CPC ........ *C23C 16/50* (2013.01); *H01J 37/32449* (2013.01); *H01J 37/32559* (2013.01); *H01J 37/32715* (2013.01)

(58) Field of Classification Search
CPC ............. H01J 37/32568; C23C 16/455; C23C 16/458; C23C 16/4583; C23C 15/4584; C23C 16/4587; C23C 16/4588; C23C 16/50; H01L 21/68764
See application file for complete search history.

(56) References Cited

OTHER PUBLICATIONS

English Machine Translation of Akinori (JP2009123513A) retrieved from ESPACENET on Oct. 11, 2022 (Year: 2022).*

* cited by examiner

A-A

A-A

B-B

B-B

COATING APPARATUS AND COATING METHOD

CROSS REFERENCE OF RELATED APPLICATION

This application is a Continuation-In-Part application that claims the benefit of priority under 35 U.S.C. § 120 to a non-provisional application, application Ser. No. 16/814,967, filed on Mar. 10, 2020, which is a non-provisional application that claims priority under 35 U.S.C. § 119 to a China application number CN201911310683.X, filed on Dec. 18, 2019, which are incorporated herewith by references in their entities.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to coating deposition, and more particularly to a coating apparatus and coating method for applying and forming a coating on a substrate which is adapted for being arranged between a discharge source of a coating forming material and a plasma generation source to avoid an excessive decomposition of the coating forming material during a coating forming process.

Description of Related Arts

A coating apparatus is arranged for forming a polymer nanocoating or film layer on a surface of a substrate, which is made of a material comprising, but is not limited to, metal, glass, ceramic, polymer, fabrics, fibers, powder, and semi-conductor, to improve various properties of the substrate such as hydrophobic, hydrophilic, oleophobic, anti-rust, mildew proof, moisture barrier, electrical and thermal conductive, biomedical, optical, and tribological performances.

A typical coating apparatus implementing a PECVD (Plasma Enhanced Chemical Vapor Deposition) process is generally constructed for introducing a gaseous coating forming material into a vacuum chamber, in which one or more substrates are disposed, to form a polymer layer on the surface of the substrate. More specifically, the gaseous coating forming material, which may comprise, but is not limited to, an organic material, an organosilicon material, an inorganic material, and a combination thereof, is a gaseous monomer or monomer vapor which is activated to be in a plasma state by discharging electrical power to the monomer to produce various types of reactive precursor species. And then, reactions between the reactive precursor species and the monomer, or between the reactive precursor species themselves take place and the polymer film is then deposited and formed on the surface of the substrate.

The monomer should be excited to produce the reactive precursor species, but an excessive exposure of the monomer in the plasma exciting media can result in an excessive decomposition of the monomer, so that a deposition velocity and a uniformity of the polymer coating is adversely affected.

Referring to FIG. 1A of the drawings, a conventional coating apparatus includes a chamber body 1, a discharge source 2 of coating forming material for introducing the coating forming material into the chamber body 1, and a plasma generation source 3 for applying an electrical power to the coating forming material so as to excite the coating forming material. As shown in the drawings, one or more substrates 4 are disposed between opposite electrodes of the plasma generation source 3. The coating forming material disperses into the space between opposite electrodes of the plasma generation source 3 to undergo an exciting process for generating the reactive precursor species. Since the coating forming material should be excited in the effect of the plasma generation source 3 and then deposit on the substrates 4 which are placed in the plasma generation source 3, an excessive decomposition of the coating forming material may occur. In addition, the exposure of the substrates 4 between the electrodes of the plasma generation source 3 may also result in a damage to the substrates 4.

Referring to FIG. 1B of the drawings, another conventional coating apparatus includes a chamber body 1, a discharge source 2 of coating forming material, and a plasma generation source 3 which is placed between the discharge source 2 of coating forming material and the substrates 4 to be coated. During the coating method, the coating forming material is required to pass through the space between opposite electrodes of the plasma generation source 3 to implement the exciting process for generating the reactive precursor species before reaching to the substrates 4.

U.S. Pat. No. 7,968,154B2, entitled "Atomization of a precursor into an excitation medium for coating a remote substrate" and U.S. Pat. No. 8,029,872B2, entitled "Application of a coating forming material onto at least one substrate" have disclosed such above coating apparatus including an atomized monomer source and a plasma excitation medium. The substrates and the atomized monomer source are respectively located on two opposite sides of the plasma excitation medium that the atomized monomer source passes through the plasma excitation medium, and then is deposited on the surfaces of the substrates on the opposite side of the plasma excitation medium to form the polymer coating. It thus can be seen that the atomized monomer can only be deposited on the surfaces of the substrates after passing through the plasma excitation medium. The plasma excitation medium can cause a relative large portion of the atomized monomer to decompose for a relatively long time, so that excessive decomposition of the atomized monomer may take place, and thus the formed coating is hard to retain the chemical properties of the atomized coating forming material.

U.S. Ser. No. 16/095,179 entitled "Multi-source low-power low-temperature plasma polymerized coating device and method" has disclosed a coating device by replacing a single high-frequency discharge source with large area and high power by combining a plurality of high-frequency discharge sources with a small area and a low power. However, this method still somehow excessively destroys a chemical monomer structure of the monomer and causes unsatisfied quality of the formed polymer coating, and the structure of the device is relatively complicated and difficult for assembling.

SUMMARY OF THE PRESENT INVENTION

The present invention is advantageous in that it provides a coating apparatus and coating method, wherein a substrate is adapted to be formed with a coating on a surface thereof without an excessive decomposition of a coating forming material during a plasma polymerization coating method.

Another advantage of the present invention is to provide a coating apparatus and coating method, wherein the substrate to be coated is adapted for being placed between a monomer discharge source for introducing the coating forming material into a chamber body and a plasma generation source for exciting the coating forming material, so that the coating forming material which is a gaseous monomer or monomer vapor is not required to pass through the plasma generation source before reaching to the substrate, and thus the excessive decomposition of the coating forming material is reduced.

Another advantage of the present invention is to provide a coating apparatus and coating method, wherein the substrate to be coated is adapted to be placed at a position having a smaller distance away from the monomer discharge source than the plasma generation source in such a manner that at least a portion of the coating forming material reaches an area for positioning the substrate before reaching to the plasma generation source, so that not all of the coating forming material is required to pass through the plasma generation source before reaching to the substrate.

Another advantage of the present invention is to provide a coating apparatus and coating method, wherein the configuration of the monomer discharge source, a supporting rack for supporting the substrate, and the plasma generation source is able to maintain a desired level of reactions between reactions between reactive precursor species, which are produced by a proportion of the monomer reaching to the plasma generation source, and another proportion of the monomer which has not decomposed into the reactive precursor species, so as to increase a quality of the formed polymer coating on the surface of the substrate.

Another advantage of the present invention is to provide a coating apparatus and coating method, wherein according to some embodiments, the substrate to be coated can be supported on the supporting rack which is movable between the monomer discharge source and the plasma generation source, so as to adjust the distance between the substrate and the plasma generation source, so as to control and adjust a composition of a formed polymer material which is deposited on the surface of the substrate.

Another advantage of the present invention is to provide a coating apparatus and coating method, wherein according to some embodiments, the plasma generation source is provided at a substantial central position of a reaction chamber of the chamber body while a plurality of the substrates can be arranged around the plasma generation source, wherein the coating forming material, which can be discharged from the monomer discharge source at a position adjacent to an inner wall of the chamber body, radially disperses into the reaction chamber and has to pass through the area for placing the substrate before reaching to the plasma generation source.

Another advantage of the present invention is to provide a coating apparatus and coating method, wherein according to some embodiments, the plasma generation source is provided at the central position of the reaction chamber of the chamber body for exciting the coating forming material dispersed into the reaction chamber, so as to increase the uniformity of a concertation of reactive precursor species around the plasma generation source, so as to increase a quality of the formed polymer coating on the surface of the substrate.

Another advantage of the present invention is to provide a coating apparatus and coating method, wherein according to some embodiments, the supporting rack for supporting the substrate can be embodied to comprise a rotation rack that rotates with respect to the plasma generation source in the reaction chamber to change a relative position between the substrate and the plasma generation source, and also functions to stir the gaseous coating forming material dispersed into the reaction chamber, so as to increase a uniformity of the polymer coating formed on the surface of the substrate.

Another advantage of the present invention is to provide a coating apparatus and coating method, wherein according to some embodiments, the supporting rack for supporting the substrate can be embodied to comprise a rotation rack that rotates in the reaction chamber to stir the gaseous monomer and the reactive precursor species, so as to evenly mix the monomer and the reactive precursor species, so that adequate reactions of the reactive precursor species and the monomer are achieved.

Another advantage of the present invention is to provide a coating apparatus and coating method, wherein according to some embodiments, the plasma generation source can be mounted to a movable rack of the supporting rack so that the plasma generation source is able to move in the reaction chamber along with the movement of the rotation rack so as to provide a relatively even electrical exciting environment for exciting the coating formation material dispersed into the reaction chamber of the chamber body.

Another advantage of the present invention is to provide a coating apparatus and coating method, wherein according to some embodiments, when the plasma generation source is mounted to the movable rack, the relative movement of the plasma generation source and the movable rack can be avoided, so that the movement of the movable rack will not provide a shielding effect to the plasma generation source.

Another advantage of the present invention is to provide a coating apparatus and coating method, wherein according to some embodiments, a plurality of the substrates is able to move with respect to the plasma generation source which is arranged at the central position of the reaction chamber, so as to adjust a distance between each substrate and the plasma generation source, so as to control the quality of the polymer coating on the surface of the substrate.

Another advantage of the present invention is to provide a coating apparatus and coating method, wherein according to some embodiments, a relative movement between the substrate and the monomer discharge source of the coating forming material is controllable, so that adequate reactions of the reactive precursor species and the monomer allow the polymer coating with high quality to be deposited on the surface of the substrate.

Another advantage of the present invention is to provide a coating apparatus and coating method, wherein according to some embodiments, a relative movement between the substrate and the plasma generation source is controllable to control the amount of the reactive precursor species reaching to the substrate, rendering adequate reactions of the reactive precursor species and the monomer before the formation of the polymer coating on the surface of the substrate.

Another advantage of the present invention is to provide a coating apparatus and coating method, wherein according to some embodiments, the substrate is adapted for being supported on a carrier rack which is operable to rotate about its central axis and is also rotating along with an rotation rack, so as to adjust a relative position between the substrate and the plasma generation source, so as to adjust the amount of the reactive precursor species and the monomer reaching to the substrate for forming the polymer coating on the surface of the substrate.

Another advantage of the present invention is to provide a coating apparatus and coating method, wherein the substrate to be coated is adapted for being arranged at an outer side of the plasma generation source, so as to avoid a damage to the substrate by the plasma generation source during the coating process.

Another advantage of the present invention is to provide a coating apparatus and coating method, wherein the coating is evenly formed on the surface of the substrate, and the deposition velocity is increased.

Another advantage of the present invention is to provide a coating apparatus and coating method, wherein the amount of the coating forming material used for forming the polymer coating is increased, so as to avoid waste and reduce cost.

Another advantage of the present invention is to provide a coating apparatus and coating method, wherein branching and cross-linking in a molecular structure of the polymer coating are enhanced, and an integrity of the molecular structure of the polymer coating is achieved, so as to ensure a good performance of the polymer coating.

Another advantage of the present invention is to provide a coating apparatus and coating method, wherein the apparatus is simple in structure, easy for operation and maintenance.

Additional advantages and features of the invention will become apparent from the description which follows, and may be realized by means of the instrumentalities and combinations particularly pointing out in the appended claims.

According to the present invention, the foregoing and other objects and advantages are attained by a coating apparatus for coating a substrate, wherein the coating apparatus comprises a chamber body, a monomer discharge source and a plasma generation source. The chamber body has a reaction chamber, wherein the chamber body has a substrate positioning area for positioning the substrate. The monomer discharge source has a discharge inlet for introducing a coating forming material into the reaction chamber of the chamber body. The plasma generation source is disposed in the reaction chamber of the chamber body for exciting the coating forming material, wherein the substrate positioning area is located at a position between the monomer discharge source and the plasma generation source in such manner that the substrate is adapted for being arranged between the monomer discharge source and the plasma generation source.

According to another aspect of the present invention, the present invention provides a coating apparatus for coating a substrate, wherein the coating apparatus comprises a chamber body having a reaction chamber, a supporting rack, a monomer discharge source and a plasma generation source. The supporting rack has a supporting area for supporting the substrate within the reaction chamber of the chamber body. The monomer discharge source has a discharge inlet for introducing a coating forming material into the reaction chamber of the chamber body. The plasma generation source is disposed in the reaction chamber of the chamber body for exciting the coating forming material, wherein the supporting area of the supporting rack is located at a position between the monomer discharge source and the plasma generation source in such manner that the substrate is adapted for being arranged between the monomer discharge source and the plasma generation source.

According to another aspect of the present invention, the present invention provides a coating method for coating a substrate, wherein the coating method comprises the following steps.

(a) Arrange the substrate in a reaction chamber of a chamber body at a position between a monomer discharge source and a plasma generation source.

(b) Introduce a coating forming material into the reaction chamber through the monomer discharge source for forming a polymer coating on a surface of the substrate in the effect of the plasma generation source.

According to another aspect of the present invention, the present invention provides a coating apparatus for coating a plurality of substrates, wherein the coating apparatus comprises a chamber body having a reaction chamber, a monomer discharge source having a discharge inlet for introducing a coating forming material into the reaction chamber of the chamber body, a plasma generation source disposed in the chamber body for exciting the coating forming material, and a supporting rack for supporting the plurality of substrates around the plasma generation source within the chamber body.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Figure 1A:
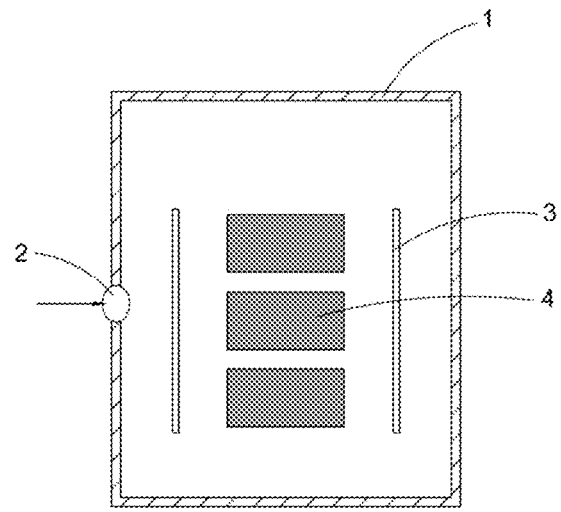
FIG. 1A is a schematic view of a conventional coating apparatus.
Figure 1B:
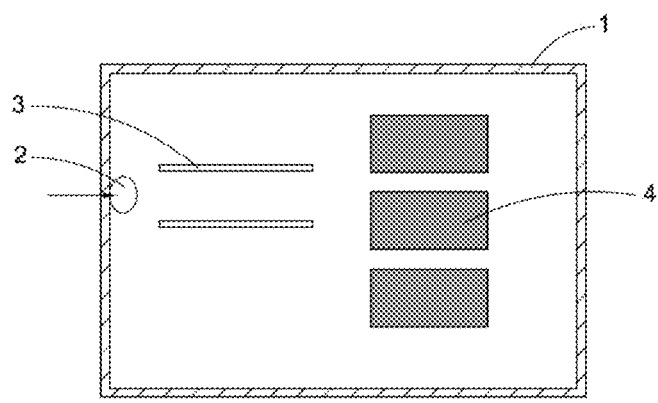
FIG. 1B is a schematic view of another conventional coating apparatus.
Figure 2A:
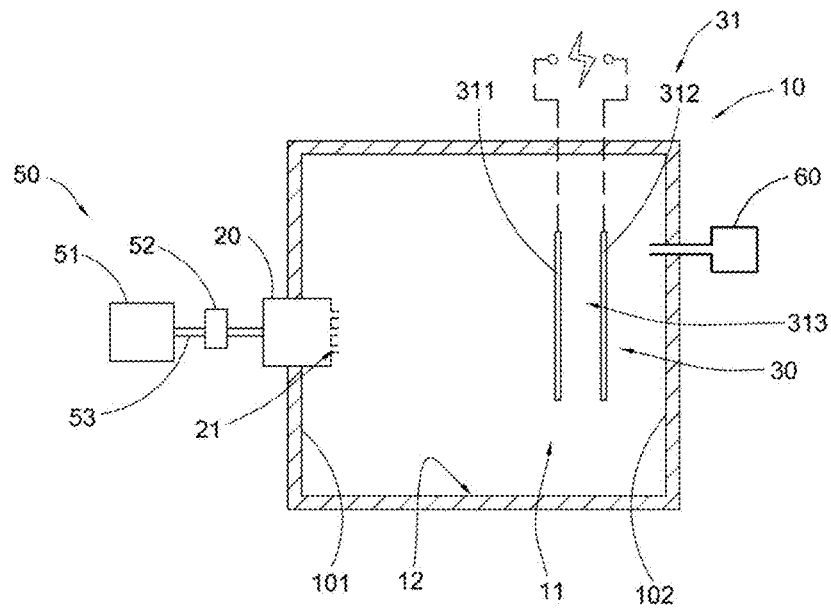
FIG. 2A is a schematic view illustrating a coating apparatus according to a first preferred embodiment of the present invention.
Figure 2B:
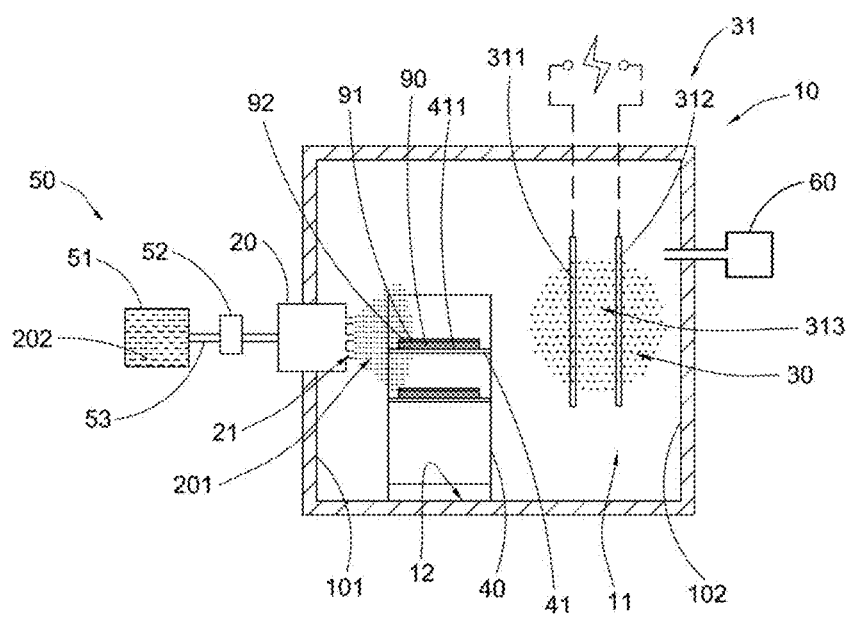
FIG. 2B is a schematic view illustrating the coating apparatus being placed with a substrate for implementing the coating method according to the above first preferred embodiment of the present invention.

Referring to FIGS. 2A and 2B of the drawings, a coating apparatus which is arranged to implement a novel plasma polymerization coating method for forming a polymer coating 92 on a surface 91 of a substrate 90 according to a first preferred embodiment of the present invention is illustrated. More specifically, the coating apparatus comprises a chamber body 10 defining a reaction chamber 11, a monomer discharge source 20 communicated to the reaction chamber 11 for introducing a gaseous coating forming material 201, which is a gaseous monomer or monomer vapor, into the reaction chamber 11 of the chamber body 10, and a plasma generation source 30 operable to induce an electrical field internally of the reaction chamber 11 for forming a plasma in such a manner that the plasma generation source 30 applies an electrical power to the coating forming material 201 to excite the coating forming material 201, so as to break down the coating forming material 201 to form reactive precursor species, so that the coating forming material 201 is activated to be in a plasma state, so as to induce reactions between the reactive precursor species and the monomer, as well as reactions between the reactive precursor species themselves in the reaction chamber 11 of the chamber body 10, so that the polymer coating 92 is then deposited and formed on the surface 91 of the substrate 90.

According to this preferred embodiment of the present invention, as shown in FIG. 2B of the drawings, the plasma generation source 30 is arranged in the reaction chamber 11 of the chamber body 10 at a position remotely from the monomer discharge source 20, the chamber body 10 has a substrate positioning area 12 which is arranged between the monomer discharge source 20 and the plasma generation source 30, so that at least one substrate 90 is suitable for being arranged in the reaction chamber 11 between the monomer discharge source 20 and the plasma generation source 30 during a plasma polymerization coating method of the present invention for forming the polymer coating 92 of the surface 91 of the substrate 90.

Accordingly, during the plasma polymerization coating method of the substrate 90, one or more substrates 90 can be disposed at the substrate positioning area 12 of the chamber body 10 in such a manner that the monomer discharge source 20 is arranged at a first side of the substrate 90 and the plasma generation source 30 is located at an opposite second side of the substrate 90, so that when the coating forming material 201 is discharged into the reaction chamber 11 of the chamber body 10, the coating forming material 201 does not have to pass through the plasma generation source 30 before reaching to the substrate 90, so as to avoid the excessive decomposition of the coating forming material 201.

More specifically, when the monomer discharge source 20 is in operation to discharge the coating forming material 201, the coating forming material 201 disperses into the reaction chamber 11 of the chamber body 10 and reaches the substrate positioning area 12 of the chamber body 10 first, only a proportion of the coating forming material 201 is subject to an exciting process of the plasma generation source 30, rendering the coating forming material 201 to decompose, polymerize and deposit on the surface 91 of the substrate to form the polymer coating 92.

In the plasma polymerization coating method of the instant invention, since the substrate 90 is adapted for being placed in a flowing route of the coating forming material 201 which flows from the monomer discharge source 20 to the plasma generation source 30, and a distance between the substrate 90 and the monomer discharge source 20 is smaller than a distance between the substrate 90 and the plasma generation source 30, not all of the coating forming material 201 is excited by the plasma generation source 30, so that excessive decomposition of the coating forming material 201 is avoided.

The substrate 90 can be directly placed on the substrate positioning area 12 of the chamber body 10. Alternatively, as shown in FIG. 2B of the drawings, a plurality of substrates 90 can be placed on a supporting rack 40, and then the supporting rack 40 which is loaded with the plurality of substrates 90 can be placed on the substrate positioning area 12 of the chamber body 10 and is received in the reaction chamber 11 of the chamber body 10. Alternatively, the supporting rack 40 can be placed on the substrate positioning area 12 of the chamber body 10 and is received in the reaction chamber 11 of the chamber body 10, and then the plurality of substrates 90 can be placed on a supporting rack 40. As another alternative mode, the supporting rack 40 is mounted to the chamber body 10 and is disposed in the reaction chamber 11, during the coating process, the plurality of the substrates 90 is put on the supporting rack 40.

The supporting rack 40 comprises a carrier rack 41 which may comprise multiple supporting platforms for supporting multiple layers of the substrates 90. The carrier rack 41 has a supporting area 411 for placing and supporting the substrate 90, and the supporting area 411 is arranged between the monomer discharge source 20 and the plasma generation source 30. In alternative modes, the whole supporting rack 40 may not be arranged between the monomer discharge source 20 and the plasma generation source 30, but as along as the supporting area 411 of the supporting rack 40 for supporting the substrate 90 is arranged between the monomer discharge source 20 and the plasma generation source 30, the substrate 90 which is adapted for being placed on the supporting area 411 of the supporting rack can be located between the monomer discharge source 20 and the plasma generation source 30.

The person of ordinary skilled in the art should understand that the substrate positioning area 12 of the chamber body 10 is an area for directly supporting one or more substrates 90, or an area for supporting and accommodating the supporting rack 40 which is adapted for being loaded with one or more substrates 90.

The chamber body 10 of the present invention is a housing defining the reaction chamber 11. A cross section of the reaction chamber 11 of the chamber body 10 can be, but not limited to, a circular shape, an oval shape, an a polygonal shape such as a rectangular shape, a pentagonal shape, a hexagonal shape, a heptagonal shape, an octagonal shape, a nonagonal shape, and a decagonal shape. As an example of this preferred embodiment, the chamber body 10 is configured to have a rectangular reaction chamber 11. The monomer discharge source 20 is arranged at a first side of the rectangular reaction chamber 11 while the plasma generation source 30 can be arranged at an opposite second side of the rectangular reaction chamber 11. As shown in the drawings, the monomer discharge source 20 can be arranged adjacent to a first side wall 101 of the chamber body 10 while the plasma generation source 30 is remotely from the monomer discharge source 20 and is arranged at a second side wall 102 of the chamber body 10 which is opposite to the first side wall 101 of the chamber body 10.

The monomer discharge source 20 has at least one discharge inlet 21 for introducing the coating forming material 201 into the reaction chamber 11 of the chamber body 10. The discharge inlet 21 can be formed in a wall of the chamber body 10 and penetrate a thickness of the wall of the chamber body 10. Alternatively, the discharge inlet 21 can be formed in a feeding nozzle which is embedded in the wall of the chamber body 10. Alternatively, the discharge inlet 21 is formed in a feeding nozzle, which is a feeding head at a distal end of a feeding tube, extending into the reaction chamber 11 of the chamber body 10.

According to this preferred embodiment of the present invention, the coating apparatus further comprises a monomer supply unit 50 for supplying the coating forming material 201 to the monomer discharge source 20. More specifically, the monomer supply unit 50 of this preferred embodiment comprises a material storage member 51 for storing a raw material 202 of the coating forming material 201, a vaporizer 52 for vaporizing the raw material 202, and a delivering tube system 53 for delivering the raw material 202 from the material storage member 51 to the monomer discharge source 20. Accordingly, the coating forming material 201 discharged through the monomer discharge source 20 is a gaseous monomer vapor material. The raw material 202 of the coating forming material 201 can be a liquid or liquid/solid slurry, either alone or in mixture, and the vaporizer 52 can comprise an atomizer, a heating device, an ultrasonic nozzle, or a nebulizer. As an example, the vaporizer 52 may comprise a heating device which is provided for heating the raw material 202 in the delivering tube system 53 for producing the gaseous monomer vapor material. The heating device may be provided at any position along the delivering tube system 53. Typically, the heating device may be provided at the position corresponding to the monomer discharge source 20, so that when the raw material 202 in a liquid state is delivered to the monomer discharge source 20, the raw material 202 will be heated by the heating device and produce the gaseous monomer vapor material which is discharged into the reaction chamber 11. The raw material 202 of the coating forming material 201 can be a powder, and the vaporizer 52 can be a plain-jet gas blast atomizer. In addition, a carrier gas may also be supplied along with the coating forming material 201. The number of the material storage member 51, the vaporizer 52, the delivering tube system 53, and the monomer discharge source 20 is not limited, one or more material storage members 51, vaporizers 52, delivering tube systems 53, and monomer discharge sources 20 may be adopted in some embodiments.

An electrical discharge manner of the plasma generation source 30 comprises, but not limited to, a direct current discharge, an alternating current discharge, an audio frequency discharge, a radio frequency discharge by a capacitive coupling or an inductive coupling, a microwave discharge by a resonant cavity, a surface wave coupling or an electron cyclotron resonance, a medium frequency discharge, a penning discharge, a spark discharge and a pulse discharge. In addition, the plasma generation source 30 can be operated to discharge electric power continuously, or in a pulsed manner.

As shown in FIGS. 2A and 2B of the drawings, the plasma generation source 30 comprises an electrode means 31 for generating an electric field in the reaction chamber 11 for establishing the plasma in the reaction chamber 11 of the chamber body 10. According to this preferred embodiment, the electrode means 31 comprises a first electrode 311 and a second electrode 312 defining a discharge field 313 between the first and second electrodes 311 and 312. As a typical example, the pair of electrodes 311 and 312 of this preferred embodiment functioning as positive and negative electrodes is disposed in the reaction chamber 11 of the chamber body 10 at a position remotely from the monomer discharge source 20, and is connected to an energy source such as an RF generator which is placed at an outer side of the chamber body 10. Alternatively, the first electrode 311 can be electrically connected to the energy source, and the second electrode 312 can be grounded. Preferably, each of the first and second electrodes 311 and 312 may further be embodied as a porous electrode which has a plurality of holes communicating the discharge field 313 with the reaction chamber 11.

The coating forming material 201 itself can function as a plasma source gas. Furthermore, the coating apparatus may further comprise a plasma source gas feeding unit for feeding a plasma source gas, which includes, but not limited to, an inert gas and nitrogen, into the reaction chamber 11 of the chamber body 10. Accordingly, before the monomer discharge source 20 feeds the coating forming material 201 into the reaction chamber 11, the plasma source gas can be injected into the reaction chamber 11 to produce the plasma in the effect of the plasma generation source 30, so as to provide a plasma environment for the coating forming material 201. In addition, the carrier gas may function as the plasma source gas, and is introduced into the reaction chamber 11 for generating the plasma before feeding the coating forming material 201 into the reaction chamber 11.

It is appreciated that the person of ordinary skilled in art is able to recognize that one or more additional discharge sources for discharging the coating forming material 201 may be arranged at the chamber body 10 in such a manner that the plasma generation source 30 is at a position between the substrate 90 and the additional discharge sources for discharging the coating forming material 201. In these embodiments, a proportion of the coating forming material 201 is discharged through the monomer discharge source 20 at a position adjacent to the substrate position area 101 of the chamber body while another proportion of the coating forming material 201 is discharged through the additional discharge source and passes through the plasma generation source 30 before reaching to the substrate 90, so that not all of the coating forming material 201 is excited by the plasma generation source 30, so as to prevent all of the coating forming material 201 being decomposed into small species.

In addition, the coating apparatus may further comprise other components such as a pressure adjustment unit 60 which is adjacent to the plasma generation source 30 and remotely from the monomer discharge source 20 for adjusting a pressure in the reaction chamber 11 of the chamber body 10, a control unit for controlling the operation of the coating apparatus, a tail gas tube for collecting a tail gas. During the plasma polymerization coating method of the present invention, the reaction chamber 11 is a vacuum chamber in the effect of the pressure adjustment unit 60 before feeding the coating forming material 201 into the reaction chamber 11. The term "vacuum chamber" means a chamber having a lower gas pressure than what is outside of the chamber, and the term does not necessarily mean that the chamber is exhausted to a vacuum state.

The substrate 90 of the present invention comprises metal, glass, ceramic, polymer, fabrics, fibers, powder, and semiconductor, and can be, but not limited to an electronic component or electronic device, a mechanical component or mechanical device, a textile or clothing, a glass product, a ceramic product, and etc. For instance, the electronic component or electronic device can be, but not limited to, a mobile phone, a pager, a radio, a loudspeaker, a microphone, a ringer, a buzzer, a hearing aid, an audio player, a television, a laptop, a notebook, a tablet computer, a keyboard, a PCB circuit board, a display, or a sensor. The polymer coating 92 can be, but not limited to a hydrophobic coating, a hydrophilic coating, an oleophobic coating, an anti-rust coating, a mildew proof coating, a moisture barrier coating, an electrical and thermal conductive coating, a biomedical coating, an optical coating, and a tribological coating. The coated surface 91 of the substrate 90 can be an entire surface of the substrate 90, or a partial area of the entire surface of the substrate 90.

The polymer coating 92 can be formed as an acrylic coating, an epoxy coating, a silicone coating, a polyurethane coating or a paraxylene coating. A typical polymer coating 92 is a hydrophobic polymeric coating while the coating forming material 201 includes —CF3 based perfluoro compounds, per fluorinated alkenes, hydrogen containing unsaturated compounds, optionally substituted alkynes, polyether substituted alkenes, organic compounds comprising two double bonds, saturated organic compounds having an optionally substituted alley chain of at least 5 carbon atoms optionally interposed with a heteroatom, macrocycles containing at least one heteroatom.

The coating forming material 201 can be a monomer of a single molecule, an oligomer, or a combination thereof. As an example, the oligomer can be a bipolymer such as Parylene C and Parylene N. As an example of the coating forming material 201, the monomer is a mixture of one or more monofunctional unsaturated fluorinated compounds and one or more polyfunctional unsaturated hydrocarbon derivatives. The monofunctional unsaturated fluorinated compounds include, but not limited to 3-(perfluoro methylhexyl)-2-hydroxypropyl methacrylate, 2-(perfluorodecyl) ethyl methacrylate, 2-(perfluorohexyl)ethyl methacrylate, 1,1,2,2-Tetrahydroperfluorotetradecyl acrylate, 1H,1H,2H, 2H-Heptadecafluorodecyl acrylate, 1H,1H,2H,2H-Perfluorooctylacrylate, 2-(Perfluorobutyl)ethyl acrylate, (2H-perfluoropropyl)-2-acrylate, (perfluorocyclohexyl)methyl acrylate, 1-propyne,3,3,3-trifluoro-, 1-ethynyl-3,5-difluorobenzene and 4-ethynyl-trifluorotoluene. The polyfunctional unsaturated hydrocarbon derivative includes, but not limited to, ethoxylated trimethylolpropane triacrylate, tripropylene glycol diacrylate, divinylbenzene, poly(ethylene glycol) diacrylate, 1,6-hexanediol diacrylate, ethylene glycol diacrylate, diethylene glycol divinyl ether and neopentyl glycol diacrylate.

As another example, the polymer coating 92 is formed on the surface 91 of the substrate 90 to protect the surface 91 from chemical corrosion and enhance hydrophobic performance. More specifically, the monomer has a structure represented by the following formula:

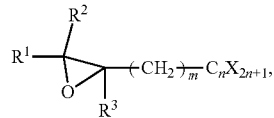

wherein R1, R2, and R3 are hydrophobic groups and are independently selected from hydrogen, alkyl, halogen, or haloalkyl, wherein m is an integer from 0-8, n is an integer from 1-15, X is selected from hydrogen or halogen, and as an example, X is fluorine.

Figure 2C:
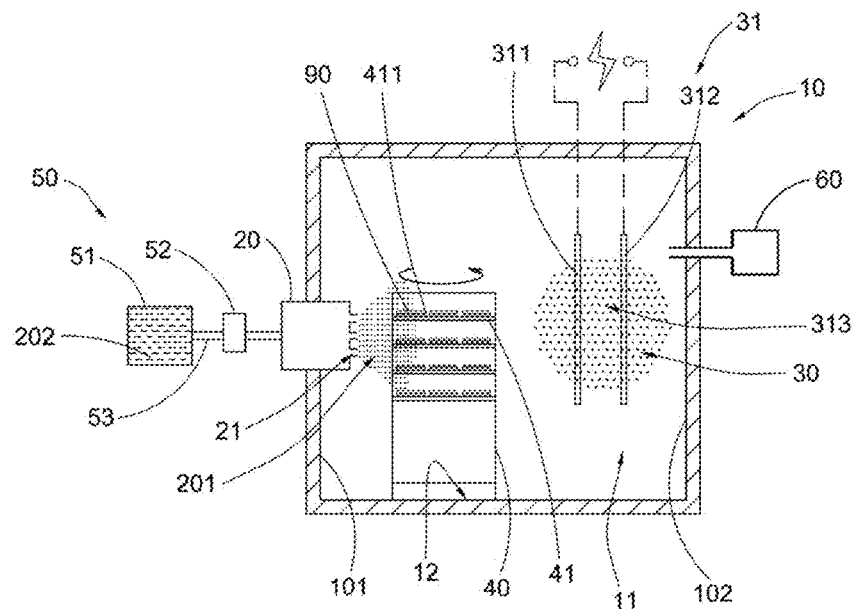
FIG. 2C is a schematic view illustrating the coating apparatus according to an alternative mode of the above first preferred embodiment of the present invention.

Referring to FIG. 2C of the drawings, an alternative mode of the coating apparatus according to the above first preferred embodiment is illustrated. The supporting rack 40 is movable in the reaction chamber 11 of the chamber body 10. As a specific example, the supporting rack 40 is operable to rotate about a central axis thereof, so that a position of the substrate 90 in the reaction chamber 11 is adjusted, so as to adjust a distance between the substrate 90 and the plasma generation source 30 and to adjust a distance between the substrate 90 and the monomer discharge source 20, so as to control and adjust a composition of a formed polymer material which is deposited on the surface 91 of the substrate 92.

Figure 2D:
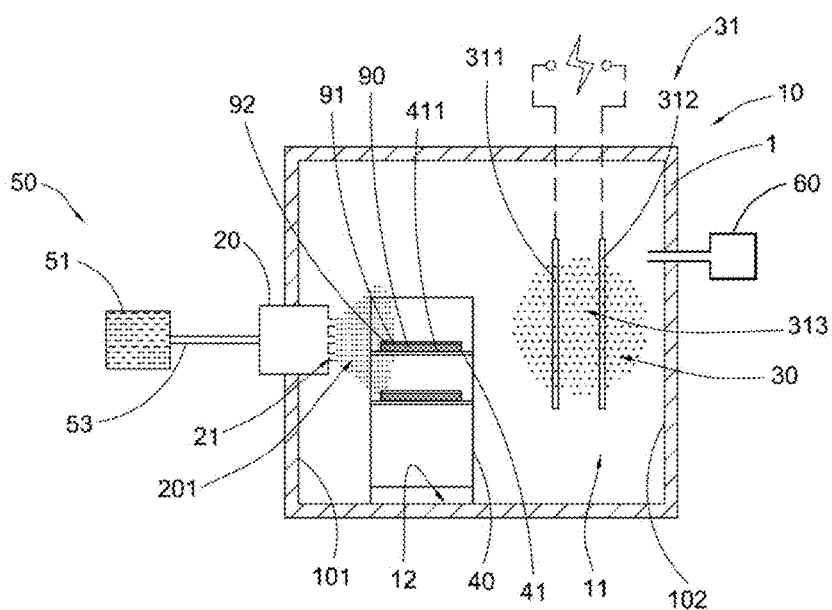
FIG. 2D is a schematic view illustrating the coating apparatus according to another alternative mode of the above first preferred embodiment of the present invention.

Referring to FIG. 2D of the drawings, another alternative mode of the coating apparatus according to the above first preferred embodiment is illustrated. In this embodiment, the monomer supply unit 50 comprises a material storage member 51 for storing a gaseous raw material of the coating forming material 201, and no vaporizer is required. In other words, the coating forming material 201 is stored in the material storage member 51 and is directly fed to the monomer discharge source 20 through the delivering tube system 53.

As an example, the coating apparatus of this preferred embodiment can be used to form a DLC (Diamond-Like Carbon) film on the surface 91 of the substrate 90. The coating forming material 201 mainly consisting of a gaseous hydrocarbon is directly introduced into the reaction chamber 11 to implement the PECVD process.

Accordingly, the present invention provides a coating method for coating the substrate 90 by the coating apparatus, and the coating method comprises the following steps.

(a) Arrange the substrate 90 in the reaction chamber 11 of the chamber body 10 at a position between the monomer discharge source 20 and the plasma generation source 30.

(b) Introduce the coating forming material 201 into the reaction chamber 11 through the monomer discharge source 20 to implement a PECVD process for forming the polymer coating 92 on the surface 91 of the substrate 90 in the effect of the plasma generation source 30.

The step (a) may comprise a step of placing one or more substrates 90 at the substrate positioning area 12 of the chamber body, wherein the monomer discharge source 20 and the plasma generation source 30 are respectively provided at two sides of the one or more substrates 90.

Alternatively, the step (a) may comprise the steps of placing one or more substrates 90 on a supporting rack 40 and placing the supporting rack 40 with the substrates 90 at the substrate positioning area 12 of the chamber body, wherein the monomer discharge source 20 and the plasma generation source 30 are respectively provided at two sides of the supporting rack 40.

Alternatively, the step (a) may comprise the steps of configuring the supporting rack 40 in the reaction chamber 11 at the substrate positioning area 12 of the chamber body 10 and loading one or more substrates 90 on the supporting rack 40, wherein the supporting rack 40 can be mounted and secured in the chamber body 10, or is just placed in the reaction chamber 11.

It is worth mentioning that the one or more substrates 90 can be horizontally, inclinedly, or vertically placed in the reaction chamber 11 of the chamber body 10.

In the step (a), the coating method comprises a step of spacedly arranging the monomer discharge source 20 and the plasma generation source 30 in the reaction chamber 11 at two opposite sides of the reaction chamber 11 of the chamber 10 and positioning one or more substrates 90 in a flowing path of the coating forming material 201 from the monomer discharge source 20 to the plasma generation source 30 in such a manner that at least a portion of the coating forming material 201 has to pass through the substrate positioning area 12 which is placed with the substrates 90 before reaching to the plasma generation source 30.

The step (b) may comprise steps of vaporizing the raw material 202 to form the coating forming material 201 which is a monomer vapor and delivering the coating forming material 201 to the monomer discharge source 20 for feeding the coating forming material 201 into the reaction chamber 11 of the chamber body 10. Accordingly, the coating forming material 201 can be pumped into the reaction chamber 11, or drawn into the reaction chamber 11 as a result of a reduction of pressure in the reaction chamber 11.

The step (b) may comprise a step of supplying the coating forming material 201 which is a gaseous monomer to the monomer discharge source 20 for feeding the coating forming material 201 into the reaction chamber 11 of the chamber body 10.

According to this preferred embodiment, in the step (b), as shown in FIG. 2B of the drawings, the coating forming material 201 is dispersed through the monomer discharge source 20 into the chamber body 10 towards the plasma generation source 30. For example, the coating forming material 201 is horizontally injected into the chamber body 10 towards the plasma generation source 30, but the supporting rack 40 is arranged between the monomer discharge source 20 and the plasma generation source 30, the coating forming material 201 is not required to pass through the plasma generation source 30 before reaching to the substrate 90 for plasma processing the substrate 90, so that not all of the coating forming material 201 is activated and excited by the plasma generation source 30.

Figure 3A:
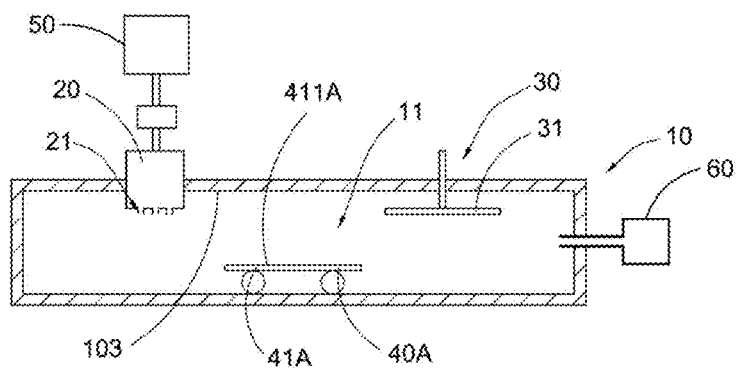
FIG. 3A is a schematic view of a coating apparatus according to a second preferred embodiment of the present invention.
Figure 3B:
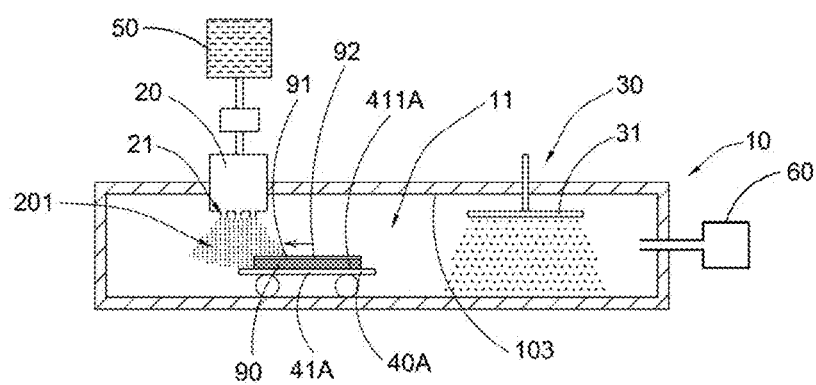
FIGS. 3B and 3C are schematic views illustrating a supporting rack which is carrying the substrate and moving between a monomer discharge source and a plasma generation source of the coating apparatus according to the above second preferred embodiment of the present invention.
Figure 3C:
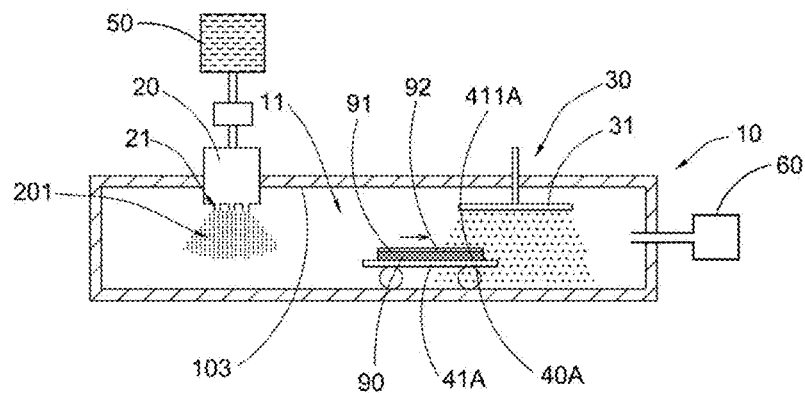

Referring to FIG. 3A to FIG. 3C of the drawings, a coating apparatus according to a second preferred embodiment of the present invention is illustrated. The coating apparatus of this preferred embodiment comprises a chamber body 10 having a reaction chamber 11, a monomer discharge source 20 for discharging a gaseous coating forming material 201 into the reaction chamber 11 of the chamber body 10, a plasma generation source 30 remotely from the monomer discharge source 20 operable to activate and excite the coating forming material 201, and a supporting rack 40A for supporting and carrying a substrate 90 on a supporting area 411A, so that when the plasma generation source 30 is in operation and a coating forming material 201 is fed into the reaction chamber 11, the substrate 90 is exposed to a plasma generated by the plasma generation source 30 to allow a polymer coating 92 to be deposited and formed on a surface 91 of the substrate 90.

According to this preferred embodiment, the supporting rack 40A is embodied as a movable supporter that is movable in the reaction chamber 11 of the chamber body 10. Particularly, the supporting rack 40A is movable between the monomer discharge source 20 and the plasma generation source 30. A movement manner of the supporting rack 40 can be, but not limited to, a linear movement, a curvilinear movement, a sliding movement or a rotating movement, so that a position of the substrate 90 in the reaction chamber 11 is adjusted, so as to adjust the amount of the monomer and the decomposed precursors which are deposited on the substrate 90 so as to increase a quality of the formed polymer coating 92 on the surface 91 of the substrate 90. In some embodiments, the movement of the supporting rack 40A provides a substantial same plasma polymerization environment for a plurality of the substrates 90, so as to enhance a uniformity of the formed polymer coatings 92 on the substrates 90.

The movement of the supporting rack 40A may be configured for producing a relative displacement between the substrate 90 and the monomer discharge source 20, or producing a relative displacement between the substrate 90 and the plasma generation source 30, or for producing both of the above mentioned relative displacements, so that an amount of the monomer which is not excited by the plasma generation source 30, or an amount of the reactive precursor species produced by breaking down the monomer, reaching to the substrate 90 can be adjusted, so as to ensure suitable and adequate reactions of the monomer and the reactive precursor species.

It is worth mentioning that the movement of the supporting rack 40A can be controlled by a control unit which is programmed to adjust a moving manner, a moving time interval, or a moving speed of the supporting rack 40A, so as to provide a desired plasma polymerization environment for the substrate 90 to obtain desired branching and cross-linking in a molecular structure of the polymer coating 92 and form the polymer coating 92 with a relatively high quality.

According to this preferred embodiment, as shown in FIG. 3A to 3C of the drawings, the supporting rack 40A is embodied as a movable supporter that is capable of repeatedly moving between the monomer discharge source 20 and the plasma generation source 30, so as to adjust the distance between the substrate 90 and the monomer discharge source 20, as well as the distance between the substrate 90 and the plasma generation source 30.

As a specific example, the chamber body 10 has a rectangular reaction chamber 11, the monomer discharge source 20 and the plasma generation source 30 can be arranged at a same side wall of the chamber body 10 and are spacedly apart from each other. For example, the monomer discharge source 20 and the plasma generation source 30 are arranged at a top side wall 103 of the chamber body 10. During the plasma polymerization coating method, the monomer discharge source 20 discharges the coating forming material 201, and a monomer area is defined in front of the monomer discharge source 20, the plasma generation source 30 is in operation for creating a plasma generation area around it, the supporting rack 40A is moving back and forth between the monomer area and the plasma area.

As shown in the drawings, in this preferred embodiment, the coating forming material 201 is not dispersed into the reaction chamber 11 through the monomer discharge source 20 towards the plasma generation source 30, but can be transversely introduced into the reaction chamber 11, and then is longitudinally dispersing towards the substrate 90 and the plasma generation source 30, so that the gaseous flow of the coating forming material 201 discharged through the monomer discharge source 20 will not directly blow the plasma generated around the plasma generation source 30, rendering a desired mixing performance of the monomer and the reactive precursor species which are broken down from the monomer.

The person of ordinary skilled in the art will understand that the supporting rack 40A, which is operable to move between the monomer discharge source 20 and the plasma generation source 30, can be driven by an electric motor, a pneumatically driving system, or a hydraulic driving system. The chamber body 10 can be provided with guiding rails or guiding grooves for retaining the supporting rack 40A in position, as well as for guiding and restricting the movement of the supporting rack 40A.

As shown in the drawings, the electrode means 31 of the plasma generation source 30 of this preferred embodiment is desired to be constructed to be a planar electrode which is extending in the reaction chamber 11, other electrode means for creating the electric field also can be adopted.

Accordingly, this preferred embodiment of the present invention provides a coating method for depositing the polymer coating 92 on the surface 91 of the substrate 90, and the coating method comprises the following steps.

(A) Feed the coating forming material 201 into the reaction chamber 11 of the chamber body 10 through the monomer discharge source 20 which is remotely from the plasma generation source 30.

(B) Move the substrate 90 between the monomer discharge source 20 and the plasma generation source 30.

(C) Activate the plasma generation source 30 to plasma process the substrate 90 for forming the polymer coating 92 on the surface 91 of the substrate 90.

It should be noted that the step sequence of the above steps (A), (B) and (C) is not limited. In the step (B), the step may comprise the steps of carrying the substrate 90 on a supporting rack 40A and driving the supporting rack 40A to repeatedly move back and forth between the monomer discharge source 20 and the plasma generation source 30. More specifically, as a preferred example, the supporting rack 40A is driven to move to adjust the distance between the substrate 90 and the monomer discharge source 20, as well as the distance between the substrate 90 and the plasma generation source 30.

Figure 4A:
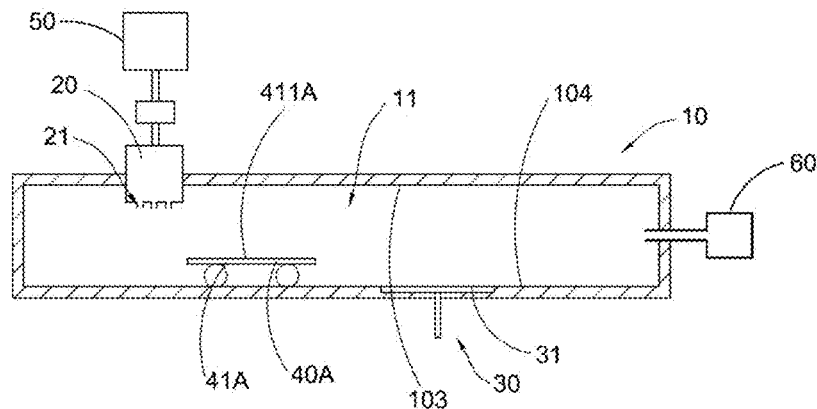
FIG. 4A is a schematic view of the coating apparatus according to an alternative mode of above second preferred embodiment of the present invention.
Figure 4B:
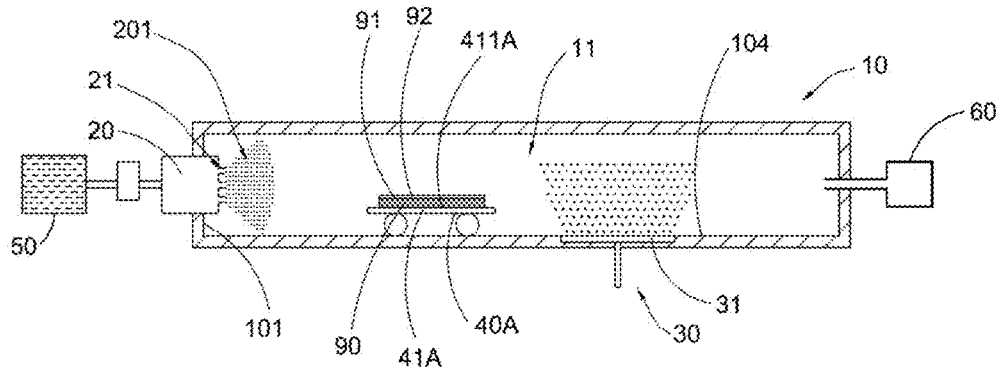
FIG. 4B is a schematic view of the coating apparatus according to another alternative mode of above second preferred embodiment of the present invention.

Referring to FIG. 4A of the drawings, as an alternative mode, the monomer discharge source 20 and the plasma generation source 30 may be arranged adjacent to two opposite side walls of the chamber body 10. For example, the monomer discharge source 20 is arranged adjacent to a top side wall 103 while the plasma generation source 30 is mounted to a bottom side wall 104 of the chamber body 10. As shown in FIG. 4B of the drawings, as another alternative mode, the monomer discharge source 20 may be arranged adjacent to at an end side wall 101 of the chamber body 10 for discharging the coating forming material 201 towards the substrate 90 while the plasma generation source 30 may be arranged at a bottom wall 104 of the chamber body 10. In other words, the monomer discharge source 20 and the plasma generation source 30 can be arranged at adjacent side walls 101 and 104 of the chamber body 10.

Figure 5A:
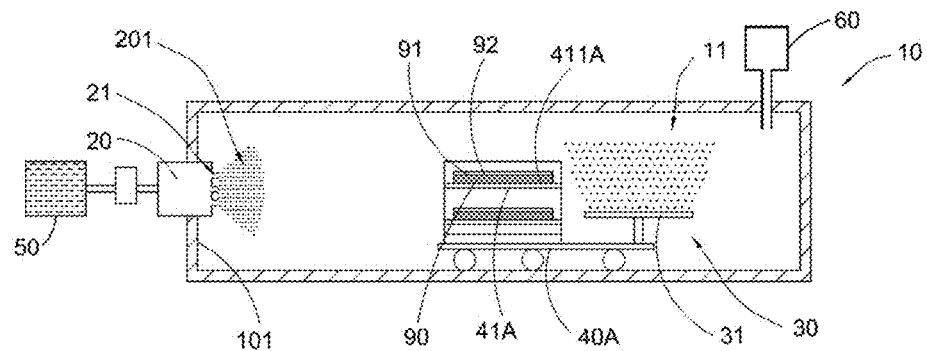
FIGS. 5A and 5B are schematic views illustrating a supporting rack which is mounted with the plasma generation source and is carrying the substrate moving between a monomer discharge source and a plasma generation source of the coating apparatus according to another alternative mode of the above second preferred embodiment of the present invention.
Figure 5B:
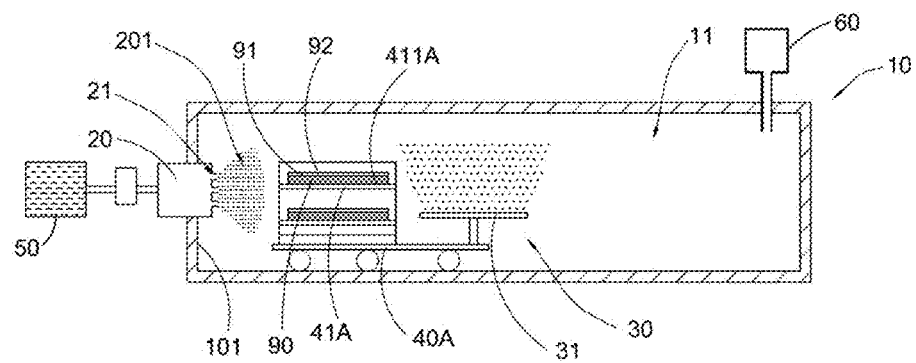

Referring to FIG. 5A and FIG. 5B of the drawings, as still another alternative mode of the above preferred embodiment, the plasma generation source 30 can be mounted to the supporting rack 40A at a side which is opposite to the monomer discharge source 20. The supporting rack 40A is immovable, or preferably, the supporting rack 40A is configured to be movable to adjust the distance between the supporting rack 40A and the monomer discharge source 20, and the distance between the monomer discharge source 20 and the plasma generation source 30 is also adjusted. According to this preferred embodiment, the relative position between the substrate 90 and the plasma generation source 30 can be fixed, but the plasma generation source 30 can move along with the supporting rack 40A to change the plasma creating environment within the reaction chamber 11 of the chamber body 10.

Figure 6A:
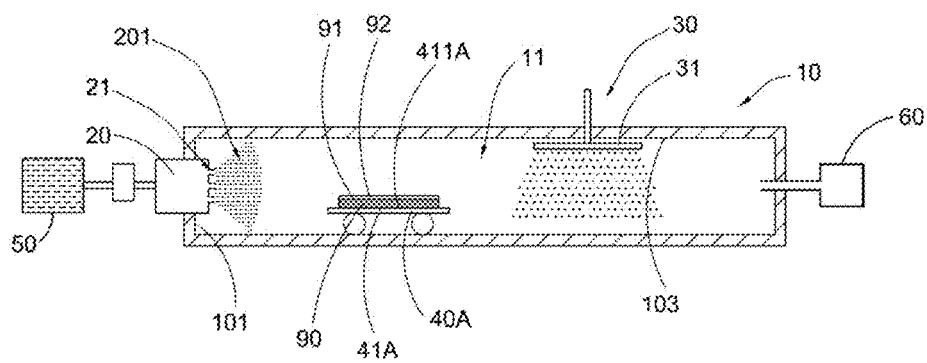
FIGS. 6A and 6B are schematic views illustrating a supporting rack which is carrying the substrate moving close to or away from a plasma generation source of the coating apparatus according to another alternative mode of the above second preferred embodiment of the present invention.
Figure 6B:
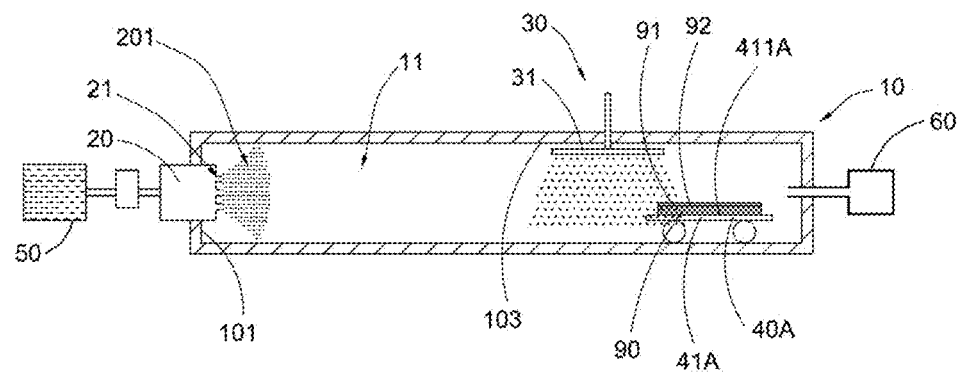

Referring to FIG. 6A and FIG. 6B of the drawings, another alternative mode of the coating apparatus is illustrated. In this embodiment, the person of ordinary skilled in the art should understand that the supporting rack 40A may also move to a position in such a manner that the plasma generation source 30 is located between the monomer discharge source 20 and the substrate 90. However, during the movement of the supporting rack 40A between the monomer discharge source 20 and the plasma generation source 30, the coating forming material 201 has to pass through the supporting rack 40A before reaching to the plasma generation source 30, so that not all of the coating forming material 201 is required to pass through the plasma generation source 30 before reaching to the substrate 90.

In other words, this preferred embodiment provides a coating method for depositing the polymer coating 92 on the surface 91 of the substrate 90 comprising the followings steps.

Move the substrate 90 in the reaction chamber 11 of the chamber body 10 defining a moving path of the substrate 90, wherein during at least a proportion of the moving path, the substrate 90 is located at a position between the monomer discharge source 20 and the plasma generation source 30.

Discharge the coating forming material 201 into the reaction chamber of the chamber body 10 to activate the plasma process of the substrate 90 during the operation of the plasma generation source 30.

Accordingly, the moving path of the substrate 90 can be divided a first proportion in which the monomer discharge source 20 and the plasma generation source 30 are respectively located at two sides of the substrate 90 and a second proportion in which the monomer discharge source 20 and the substrate 90 are respectively located at two sides of the plasma generation source, and the first portion of the moving path can be significantly larger than the second portion of the moving path of the substrate 90 which is carried by the supporting rack 40A.

Figure 7:
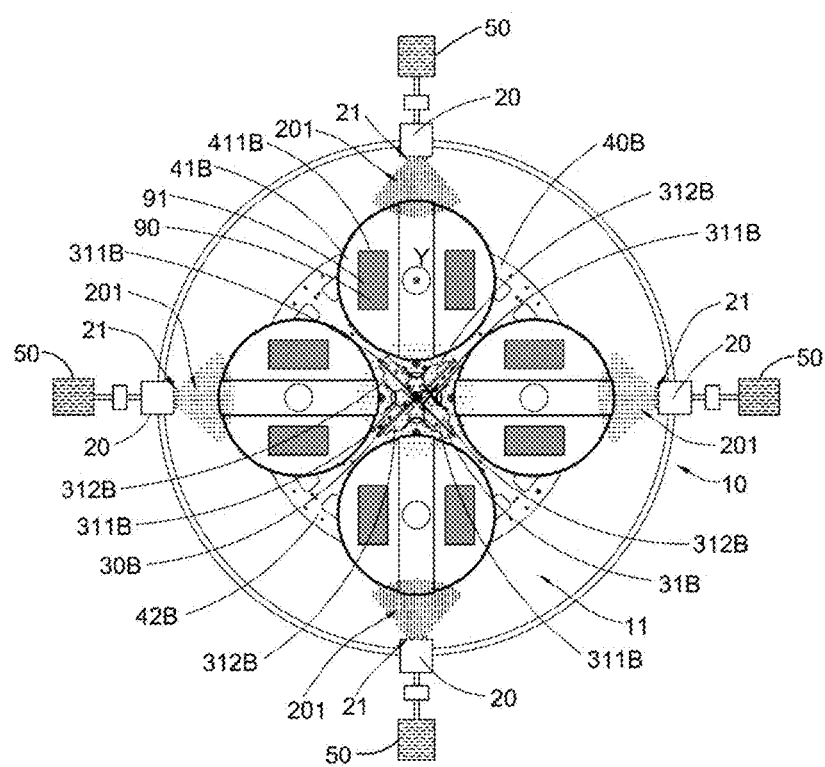
FIG. 7 is a schematic view of a coating apparatus according to a third preferred embodiment of the present invention.

Referring to FIG. 7 of drawings, a coating apparatus according to a third preferred embodiment of the present invention is illustrated. More specifically, the coating apparatus of this preferred embodiment comprises a chamber body 10 having a reaction chamber 11, one or more monomer discharge sources 20 for discharging a gaseous coating forming material 201 into the reaction chamber 11 of the chamber body 10, a plasma generation source 30B for exciting the coating forming material 201, and a supporting rack 40B for supporting and carrying a substrate 90, so that when the plasma generation source 30B is in operation and a coating forming material 201 is fed into the reaction chamber 11 through the one or more monomer discharge sources 20, a polymer coating 92 is deposited and formed on a surface 91 of the substrate 90.

According to this preferred embodiment, the plasma generation source 30B is arranged at a substantial central area of the supporting rack 40B. In this embodiment, the plasma generation source 30B may not be mounted to the supporting rack 40B, and is mounted to the chamber body 10 and supported in the reaction chamber 11. Preferably, the plasma generation source 30B can be arranged at the center of the reaction chamber 11 of the chamber body 10 while a plurality of substrates 90 which is to be coated with the polymer coating 92 is adapted for being arranged around the plasma generation source 30B to encircle the plasma generation source 30B, so that the substrate 90 is adapted for being arranged between the plasma generation source 30B and the monomer discharge source 20.

Accordingly, the plasma generation source 30B is arranged at the center of the reaction chamber 11 of the chamber body 10, so as to provide a relatively even electrical exciting environment in the reaction chamber 11 of the chamber body 10. More specifically, when the coating forming material 201 is discharged into the reaction chamber 11, the coating forming material 201 which is the monomer is excited by the plasma generation source 30B to produce reactive precursor species that are relatively evenly dispersed around the plasma generation source 30B.

Accordingly, as shown in the drawings, the plasma generation source 30B is provided at a central area 111 of the reaction chamber 11 of the chamber body 10 for exciting the coating forming material 201 dispersed into the reaction chamber 11, the uniformity of a concertation of reactive precursor species around the plasma generation source 30B is increased, so as to increase a quality of the formed polymer coating 92 on the surface 91 of the substrate 90.

More specifically, a plurality of monomer discharge sources 20, such as four monomer discharge sources 20, can be arranged at positions adjacent to an inner wall of the chamber body 10, and coating forming material 201 can be discharged at positions adjacent to an inner perimeter of the chamber body 10 and flow towards the plasma generation source 30B at the central position of the chamber body 10. Since the plurality of monomer discharge sources 20 and the plasma generation source 30B are provided at two opposite sides of the substrate 90, excessive decomposition of the coating forming material 201 is prevented.

The plasma generation source 30B of this preferred embodiment of the present invention comprises an electrode means 31B for applying an electric power to the coating forming material 201 discharged into the chamber body 10. More specifically, as an example, the electrode means 31B comprises at least one pair of electrodes, preferably, a plurality of pairs of first electrode 311B and second electrode 312B are provided at the center of the reaction chamber 11. As shown in FIG. 7 of the drawings, each of the first electrodes 311B and second electrodes 312B can be embodied as an elongated electrode plate vertically arranged in the reaction chamber 11 of the chamber body 10. In this exemplifying embodiment, four first electrodes 311B and four second electrodes 312B are alternatingly arranged along a circumferential direction.

The first electrodes 311B and the second electrodes 311B are positive and negative electrodes, and are respectively electrically connected to two connecting ends of an energy source such as an RF generator which is placed at an outer side of the chamber body 10. Alternatively, the first electrode 311B can be electrically connected to the energy source, and the second electrode 312B can be grounded.

The supporting rack 40B of this preferred embodiment comprises one or more carrier racks 41B for carrying one or more substrates 90. Each of the carrier racks 41B has a supporting area 411B for positing the substrate 90 which can be horizontally, inclinedly, and vertically placed at the carrier set 411B. In this embodiment, the substrate 90 can be horizontally placed at the supporting area 411B and is retained and supported by the supporting area 411B.

According to this preferred embodiment, a plurality of supporting areas 411B of one or more carrier rack 41B is arranged between the plasma generation source 30B and the monomer discharge source 20, so that when one or more substrates 90 are placed at the corresponding supporting area 411B, the monomer discharge source 20 and the plasma generation source 30B are respectively arranged at two opposite sides of each corresponding substrate 90.

Furthermore, each of the carrier racks 41B of the supporting rack 40B of this preferred embodiment can carry a plurality of the substrates 90 and is movable in the reaction chamber 11, and the movement of each of the carrier racks 41B can be, but not limited to, a linear movement, a curvilinear movement, a sliding movement, and a rotation movement. As a specific example of this preferred embodiment, each of the carrier racks 41B of the supporting rack 40B is operable to rotate about a central axis Y thereof.

The supporting rack 40B of this preferred embodiment further comprises a movable rack 42B for supporting the one or more carrier racks 41B. The movement of the movable rack 42B also can be, but not limited to, a linear movement, a curvilinear movement, a sliding movement, and a rotation movement.

According to this preferred embodiment, the movable rack 42B is functioning as a rotation rack that is operable to rotate about a central axis X within the reaction chamber which is embodied as a circular chamber, and since the carrier racks 41B are supported on the movable rack 42B, each of the carrier racks moves along with the movable rack 42B while simultaneously self-rotate with respect to its central axis Y, so that two types of the movements of the carrier racks 41B change the relative position between each of the substrates 90 and the plasma generation source 30.

The movement of the movable rack 42B and the movement of the carrier racks 41B also function to stir the coating forming material 201 in the reaction chamber 11, so as to evenly mix the monomer and the reactive precursor species around the plasma generation source 30B, so as to increase the quality of the polymer coating 92 on the surface 91 of the substrate 90.

Accordingly, the present invention further provides a coating method for coating a plurality of substrates 90, comprising the following steps.

(I) Arrange the plasma generation source 30B at a central area 111 of the reaction chamber 11 of the chamber body 10.

(II) Place the plurality of substrates 90 around the plasma generation source 30B.

(III) Discharge the coating forming material 201 into the reaction chamber 11 of the chamber body 10 through the monomer discharge source 20 and activate the plasma generation source 30D to plasma processing the plurality of substrates 90.

Figure 8:
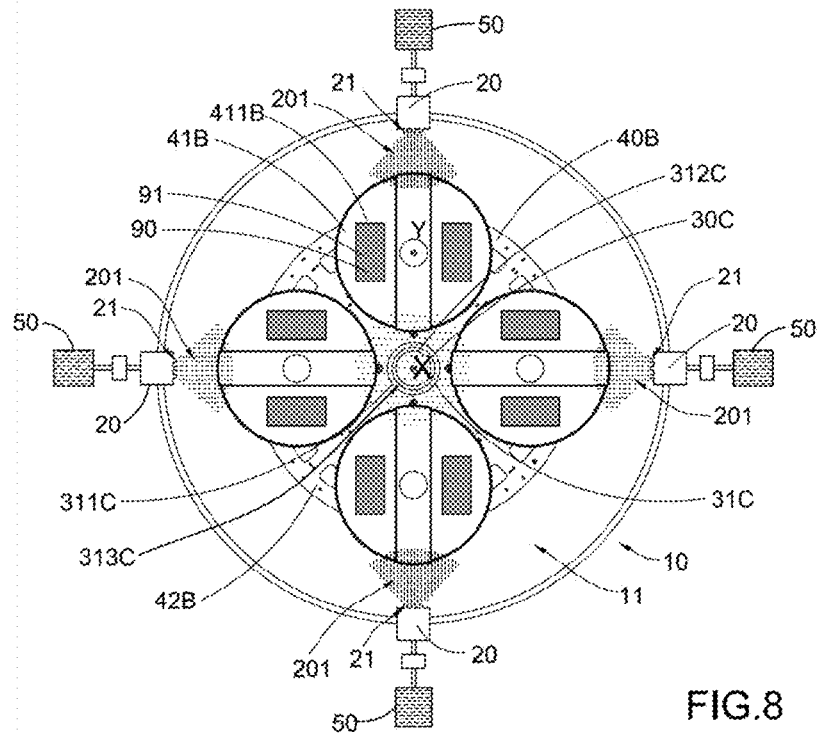
FIG. 8 is a schematic view of the coating apparatus according to an alternative mode of the above third preferred embodiment of the present invention.

Accordingly, in the Step (II), the method may further comprise a step of moving the plurality of substrates 90 around the plasma generation source 30B, the step (III) may comprise a step of radially discharging the coating forming material 201 through a plurality of monomer discharge sources 20 towards said plasma generation source 30B at a central of the reaction chamber 11 of the chamber body 10. Referring to FIG. 8 of the drawings, as an alternative mode of the above third preferred embodiment of the present invention, the coating apparatus comprise a plasma generation source 30C which comprises an electrode means 31C. The electrode means 31C of this preferred embodiment comprises a first electrode 311C and a second electrode 312C each of which is embodied as a cylindrical electrode, the first electrode 311C is sleeved around the second electrode 312C to define a circular discharge field 313C between the first electrode 311C and the second electrode 312C. The first electrode 311C can be electrically connected to an energy source such as an RF generator, and the second electrode 312C can be grounded. The plasma generation source 30C is provided at a central area 111 of the reaction chamber 11 of the chamber body 10 for providing a relatively even electrical discharging environment for the coating forming material 201 fed into the reaction chamber 11.

In addition, the first electrode 311C can be embodied as a porous electrode having a plurality of holes that communicate the discharge field 313C to the reaction chamber 11, the second electrode 312C is formed as an elongated tube having communicating holes which are communicated with the reaction chamber 11, so that it may further function as a gas extracting tube communicated to an outer side of the reaction chamber 11 of the chamber body 10 for extracting the gaseous mixture out of the reaction chamber 11 of the chamber body 10, so as to adjust the pressure within the reaction chamber 11 as well as to remove the tail gas in the reaction chamber 11.

Figure 9:
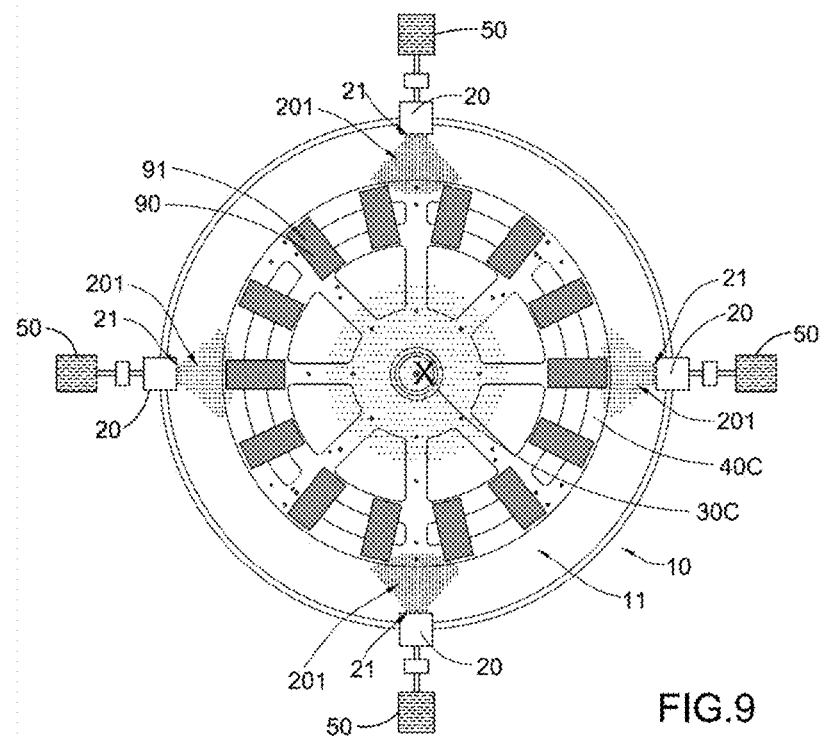
FIG. 9 is a schematic view of the coating apparatus according to another alternative mode of above third preferred embodiment of the present invention.

Referring to FIG. 9 of the drawings, according to another alternative mode of the above preferred embodiment of the present invention, the coating apparatus comprises the plasma generation source 30C and a supporting rack 40C. In this preferred embodiment, the supporting rack 40C functions as a rotation rack that is capable of rotating about its central axis X, and a plurality of substrates 90 can be directly put on the supporting rack 40C without requiring the carrier racks 41B mentioned above. The displacement of the plurality of substrates 90 is resulting from the rotation of the supporting rack 40C. The plasma generation source 30C is provided at a central area 111 of the reaction chamber 11 of the chamber body 10 for providing a relatively even electrical discharging environment for the coating forming material 201 fed into the reaction chamber 11.

According to this preferred embodiment of the present invention, a coating method for depositing the polymer coating 92 on the surface 91 of each of the plurality of substrates 90 comprises the following steps.

(α) Surround the plasma generation source 30B/30C by the plurality of substrates 90 and configure the monomer discharge source 20 and the plasma generation source 30B/30C at two opposite sides of the substrates 90.

(β) Discharge the coating forming material 201 into the reaction chamber 11 of the chamber body 10 to plasma processing the substrates 90 by the plasma generation source 30B/30C.

Accordingly, in the step (α), the plasma generation source 30B/30C is arranged at an inner side of the substrates 90 while the monomer discharge source 20 is arranged at an outer side of the substrates 90. The plasma generation source 30B/30C can be arranged at a central area of the reaction chamber 11 and the substrates 90 are encircled around the plasma generation source 30B/30C.

In the step (β), at least a proportion of the coating forming material 201 is required to pass through the supporting rack 40B/40C which is carried with the substrates 90 before reaching to the plasma generation source 30B/30C.

The step (β) may further comprise a step of circumferentially arranging a plurality of the monomer discharge sources 20 and radially discharging the coating forming material 201 through the monomer discharge sources 20 towards the plasma generation source 30B/30C at the central area of the reaction chamber 11 of the chamber body 10.

The coating method may further comprise the steps of rotating a rotation rack 42B about the central axis X and rotating the carrier racks 41B about the central axis Y, wherein each of the carrier racks 41B, which is used for carrying the substrates 90, is supported on the rotation rack 42B to rotate about the axis X along with the rotation rack 42B while simultaneously rotate about its own axis Y.

Referring to FIGS. 10 to 17 of the drawings, a coating apparatus according to a third preferred embodiment of the present invention is illustrated. More specifically, the coating apparatus of this preferred embodiment comprises a chamber body 10 having a reaction chamber 11, a discharge source 20 having a discharge inlet 21 for discharging a gaseous coating forming material 201 into the reaction chamber 11 of the chamber body 10, a plasma generation source 30D for exciting the coating forming material 201, so that when the plasma generation source 30D is in operation and a coating forming material 201 is fed into the reaction chamber 11 through the monomer discharge source 20, a polymer coating 92 is deposited and formed on a surface 91 of the substrate 90.

According to this preferred embodiment, the plasma generation source 30D is arranged at a central area 111 of the reaction chamber 11 of the chamber body 10. A plurality of substrates 90 can be adapted for being arranged around the plasma generation source 30D and being positioned between the plasma generation source 30D and the monomer discharge source 20. The plasma generation source 30D which is preferred to be arranged at the center of the reaction chamber 11 is able to provide an electrically discharging field at the center area 111 of the reaction chamber 11, so that the coating forming material 201 dispersed into the reaction chamber 11 is able to be excited by the plasma generation source 30D and evenly and radially disperse from the area corresponding to the plasma generation source 30D to the space around the plasma generation source 30D within the reaction chamber 11, so that the excited coating forming material is able to relatively evenly reach to the substrates 90 around the plasma generation source 30D, so that the substrates 90 are able to be formed with the polymer coating 92 of relatively increased uniformity.

The plurality of substrates 90 can be directly placed on a substrate positioning area of the chamber body 10. Preferably, as shown in the drawings, the coating apparatus further comprises a supporting rack 40D for supporting and carrying the plurality of substrates 90. The supporting rack 40D can be fixed or detachably mounted to the chamber body 10 and is disposed in the reaction chamber 11, during the coating process, the plurality of substrates 90 is put on the supporting rack 40D.

According to this preferred embodiment, the plasma generation source 30D is mounted at the supporting rack 40D. Preferably, the plasma generation source 30D can be arranged at the center of the supporting rack 40D while the plurality of substrates 90 is adapted for being arranged around the plasma generation source 30B, so that the plurality of substrates 90 is adapted for being arranged between the plasma generation source 30D and the monomer discharge source 20.

Preferably, the supporting rack 40D of this embodiment is operable to move in the reaction chamber 11 of the chamber body 10. Since the plasma generation source 30D is mounted at the supporting rack 40D, the plasma generation source 30D will move along with the supporting rack 40D when the supporting rack 40D is actuated to move. Particularly, the supporting rack 40D is operable to rotate within the reaction chamber 11, and the plasma generation source 30D is also driven to rotate along with the supporting rack 40D, so that a relatively even electrical discharging environment is provided to the coating forming material 201 introduced into the reaction chamber 11 of the chamber body 10. The rotating supporting rack 40D also can function to stir the coating forming material 201 supplied into the reaction chamber, so as to evenly mix the monomer and the reactive precursor species generated from the excited coating forming material, so as to obtain adequate reactions between the reactive precursor species and reactions between the monomer and the reactive precursor species.

More specifically, the supporting rack 40D comprises one or more carrier racks 41D, such as four carrier racks 41D, and a movable rack 42D for supporting the carrier racks 41D. The plasma generation source 30D is mounted at the movable rack 42D of the supporting rack 40D. When the movable rack 42D is operable to rotate in the reaction chamber 11, the carrier racks 41D and the plasma generation source 30D will be driven to rotate along with the movable rack 42D.

According to this preferred embodiment, the plasma generation source 30D can rotate along with the movable rack 42D, the relative movement of the plasma generation source 30D and the movable rack 42D can be avoided, so that the movement of the movable rack 42D will not provide a shielding effect to the plasma generation source 30D.

Figure 10:
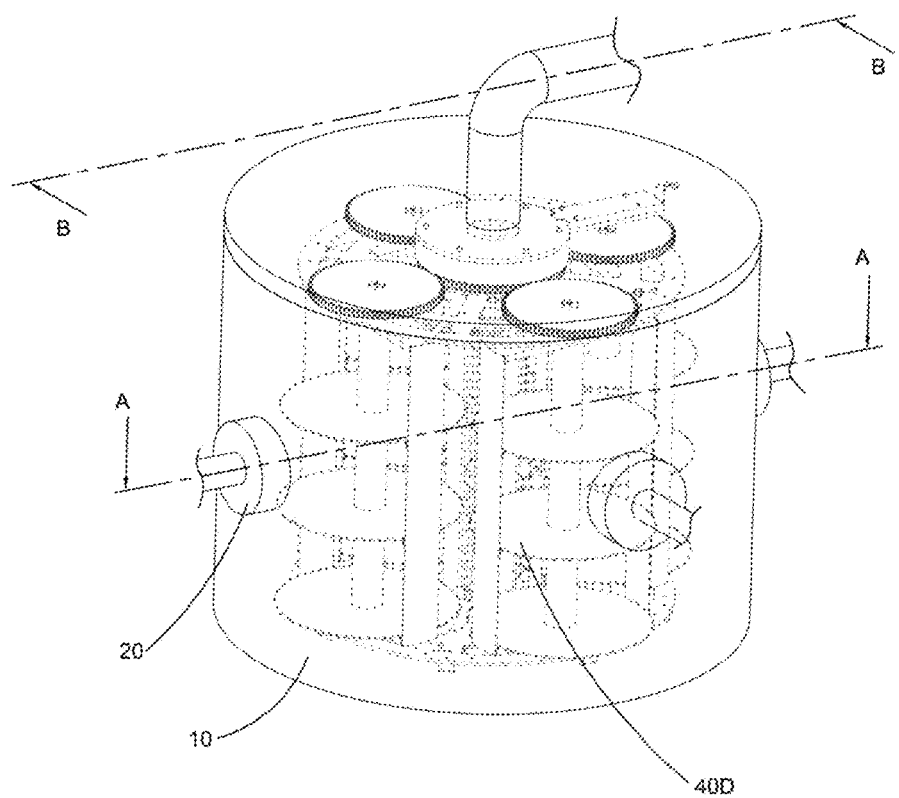
FIG. 10 is a perspective view of a coating apparatus according to a fourth preferred embodiment of the present invention.
Figure 11:
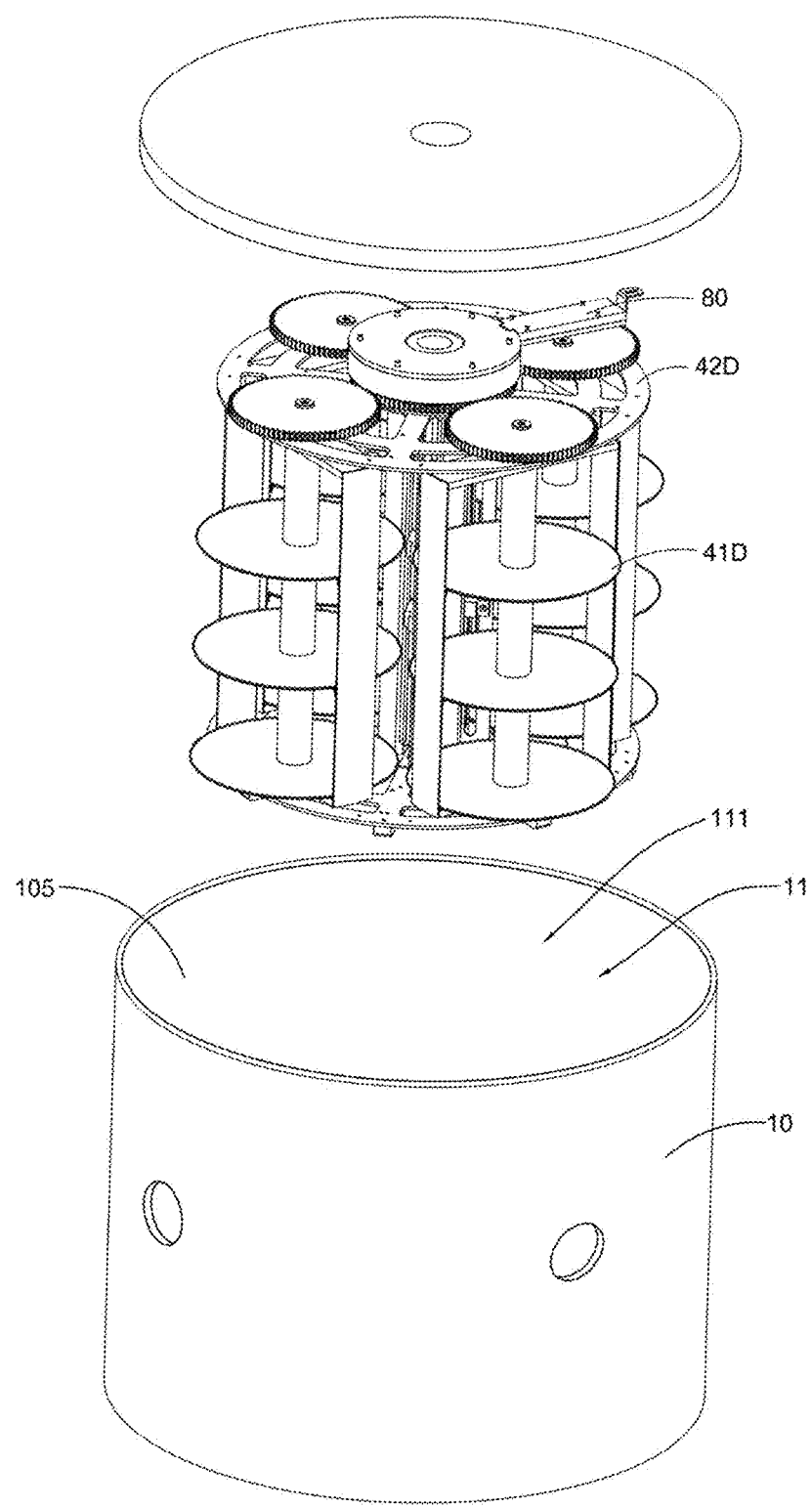
FIG. 11 is a perspective view of a movable supporting rack with a plasma generation source of the coating apparatus according to the above fourth preferred embodiment of the present invention.
Figure 12:
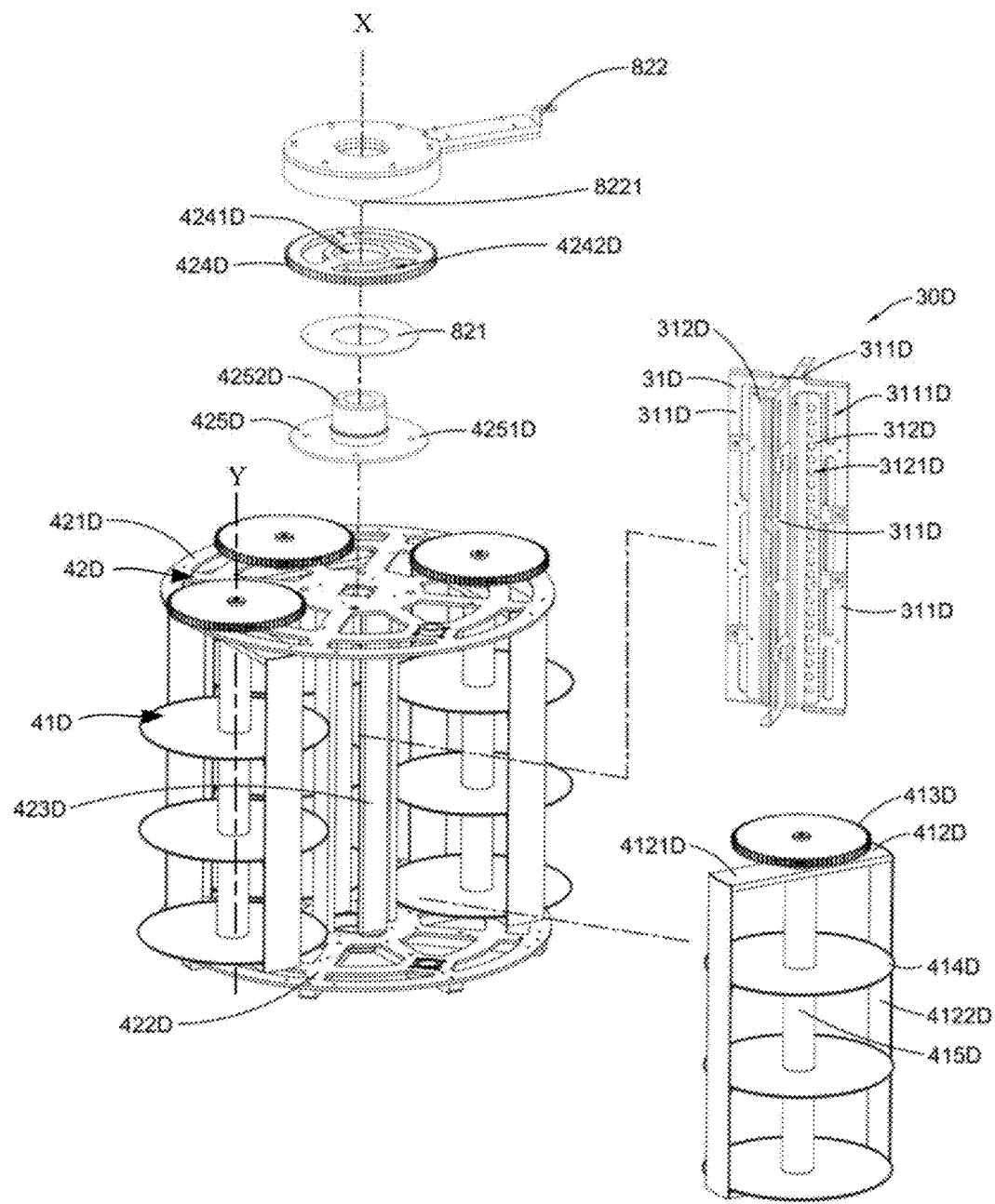
FIG. 12 is an exploded view of the movable supporting rack with a plasma generation source of the coating apparatus according to the above fourth preferred embodiment of the present invention.

More specifically, as shown in FIGS. 10 to 12 of the drawings, the movable rack 42D comprises a top frame 421D, a lower frame 422D and a plurality of connectors 423D extended between the top frame 421D and the lower frame 422D. The carrier racks 41D are supported by the top frame 421D and the lower frame 422D of the movable rack 42D. As shown in the drawings, four carrier racks 41D are positioned above the lower frame 422D along a circumferential direction of the movable rack 42D.

Furthermore, each of the carrier racks 41D of the supporting rack 40D of this preferred embodiment can carry a plurality of the substrates 90 and is movable in the reaction chamber 11, and the movement of each of the carrier racks 41D can be, but not limited to, a linear movement, a curvilinear movement, a sliding movement, and a rotation movement. As a specific example of this preferred embodiment, each of the carrier racks 41D of the supporting rack 40D is operable to rotate about a central axis Y thereof.

More specifically, according to this preferred embodiment, the movable rack 42D is functioning as a rotation rack that is operable to rotate about a central axis X within the reaction chamber 11 which is embodied as a circular chamber, and since the carrier racks 41D are supported on the movable rack 42D, each of the carrier racks moves along with the movable rack 42D while simultaneously self-rotate with respect to its central axis Y, so that two types of the movements of the carrier racks 41D change the relative position between each of the substrates 90 and the plasma generation source 30D, the disclosure of US20190085447A1 is incorporated herewith by references in its entities.

During the plasma coating method, since the plurality of substrates 90 is supported on the carrier racks 41D, each of the carrier racks 41D is operable to rotate with its central axis Y, the plurality of substrates 90 is able to move with respect to the plasma generation source 30D which is arranged at the central area 11 of the reaction chamber 11, so that one or more substrates 90 which are supported on one of the carrier racks 41D are repeatedly and alternatingly moving close to the plasma generation source 30D, so as to provide an relatively even plasma processing field to the plurality of substrates 90, and thus the quality of the polymer coatings 92 on the surfaces of the plurality of substrates 90 is enhanced.

As shown in the drawings, four monomer discharge sources 20 are arranged at positions adjacent to an inner wall 105 of the chamber body 10, and the coating forming material 201 can be discharged at positions adjacent to an inner perimeter of the chamber body 10 and flow towards the plasma generation source 30D at the central area 111 of the chamber body 10. Accordingly, the coating forming material 201 can be evenly and radially introduced into the reaction chamber 11 and disperse towards the center of the reaction chamber 11, the plasma generation source 30D at the central area 111 of the reaction chamber 11 generates an electrical discharging field for the coating forming material 201 to excite the coating forming material 201, a relatively even mixture of the monomer and the reactive precursor species is provided in the reaction chamber 11, so as to increase the uniformity of the polymer coatings 92 formed on the surfaces 91 of the substrates 90.

In addition, since the plurality of monomer discharge sources 20 and the plasma generation source 30D are provided at two opposite sides of the substrate 90 to configure the plurality of substrates 90 at positions between the monomer discharge sources 20 and the plasma generation source 30D, so that excessive decomposition of the coating forming material 201 is prevented.

Each of the carrier racks 41D comprises a carrier frame 412D, a rotation gear 413D, one or more supporting seats 414D for supporting the plurality of substrates 90, and a rotation shaft 415D which is operable to rotate so as to drive the carrier rack 41D to rotate. More specifically, the carrier frame 412D comprises a supporting arm 4121D and two retention arms 4122D extended from two ends of the supporting arm 4121D respectively. The rotation gear 413D is mounted and supported on the supporting arm 4121D, the supporting seats 414D are connected to the two retention arms 4122D.

As shown in the drawings, the rotation gear 413D is supported on the top frame 421D. The movable rack 42D further comprises a retention gear 424D mounted on top of the top frame 421D. The plurality of rotation gears 413D is provided around the retention gear 424D. More specifically, each of the rotation gears 413D is engaged with the retention gear 424D and can be driven by the rotation shaft 415D to rotate with respect to the retention gear 424D.

Accordingly, each of the carrier racks 41D is able to rotate along with the movable rack 42D when the movable rack 42D is actuated to rotate with respect its central axis X, while being driven to rotate with respect to its central axis Y, the retention gear 424D at the center of movable rack 42D guides the rotation of each of the rotation gears 413D. The plurality of substrates 90 which is supported on the corresponding supporting seats 414D will rotate along with the movable rack 42D as well as rotate with respect the plasma generation source 30D.

The plasma generation source 30D of this preferred embodiment of the present invention comprises an electrode means 31D for applying an electric power to the coating forming material 201 discharged into the chamber body 10. More specifically, as an example, the electrode means 31D comprises at least one pair of electrodes, preferably, a plurality of pairs of first electrode 311D and second electrode 312D are provided at the center of the reaction chamber 11. As shown in FIG. 12 of the drawings, each of the first electrodes 311D and second electrodes 312D can be embodied as an elongated electrode plate vertically arranged in the reaction chamber 11 of the chamber body 10. In this exemplifying embodiment, a plurality of first electrodes 311D and second electrodes 312D can be alternatingly arranged along a circumferential direction. Alternatively, a pair of electrodes is provided in such a manner that each of the first and second electrodes 311D and 312D is an electrode sleeve. Alternatively, a pair of electrodes is provided in such a manner that the first and second electrodes 311D and 312D are parallel electrode plates. Each of the first electrodes 311D may have a plurality of first communicating holes 3111D, while each of the second electrodes 312D may have a plurality of second communicating holes 3121D, the communicating holes 3111D and 3121D facilitate the gaseous coating forming material 201 to reach to and flow out of an electrical discharging aera between the corresponding first electrode 311D and the second electrode 312D.

Correspondingly, the coating apparatus further comprises a power supply arrangement 80 which comprises an electrical power source 81 and an electrical connecting element 82 for electrically connecting the first electrode 311D to the electrical power source 81. Accordingly, the first electrodes 311D and the second electrodes 312D are positive and negative electrodes, and can be respectively electrically connected to two connecting ends of the electrical power source 81 such as an RF generator which is placed at an outer side of the chamber body 10. According to this embodiment, the first electrode 311D can be electrically connected to the electrical power source 81, and the second electrode 312D can be grounded.

Figure 13:
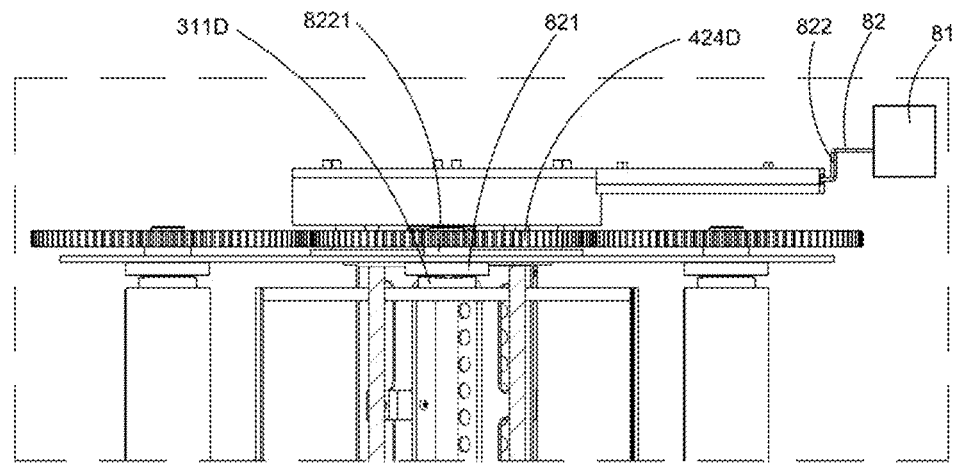
FIG. 13 is an enlarged partial view illustrating the electrical connection between a power source and the plasma generation source of the coating apparatus according to the above fourth preferred embodiment of the present invention.
Figure 14:
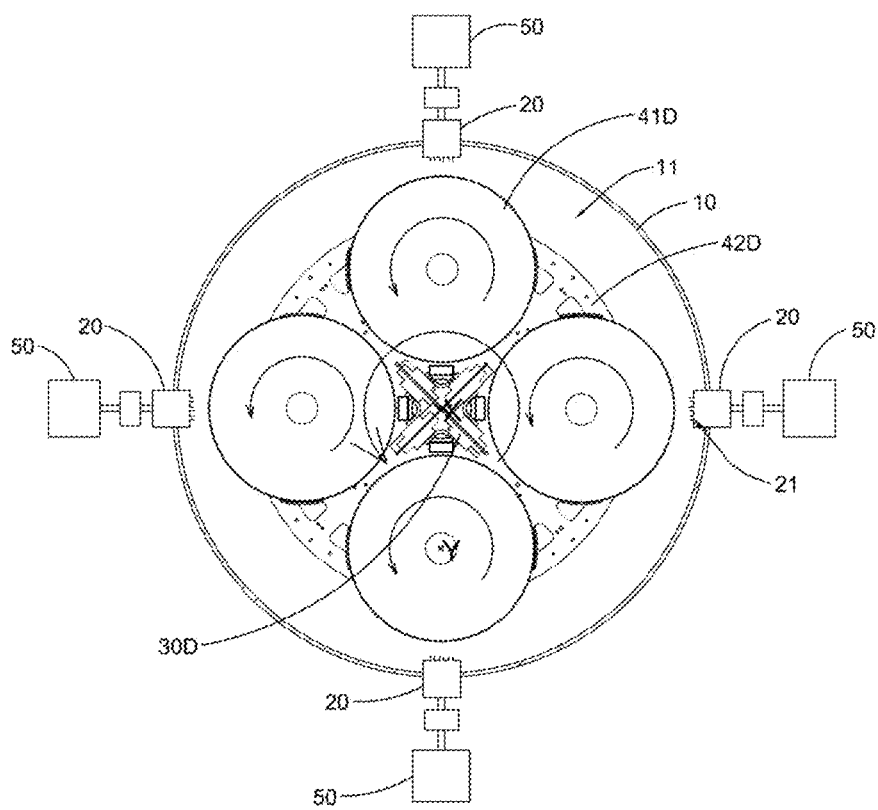
FIG. 14 is a schematic view illustrating the movement of the movable supporting rack of the coating apparatus according to the above fourth preferred embodiment of the present invention.
Figure 15:
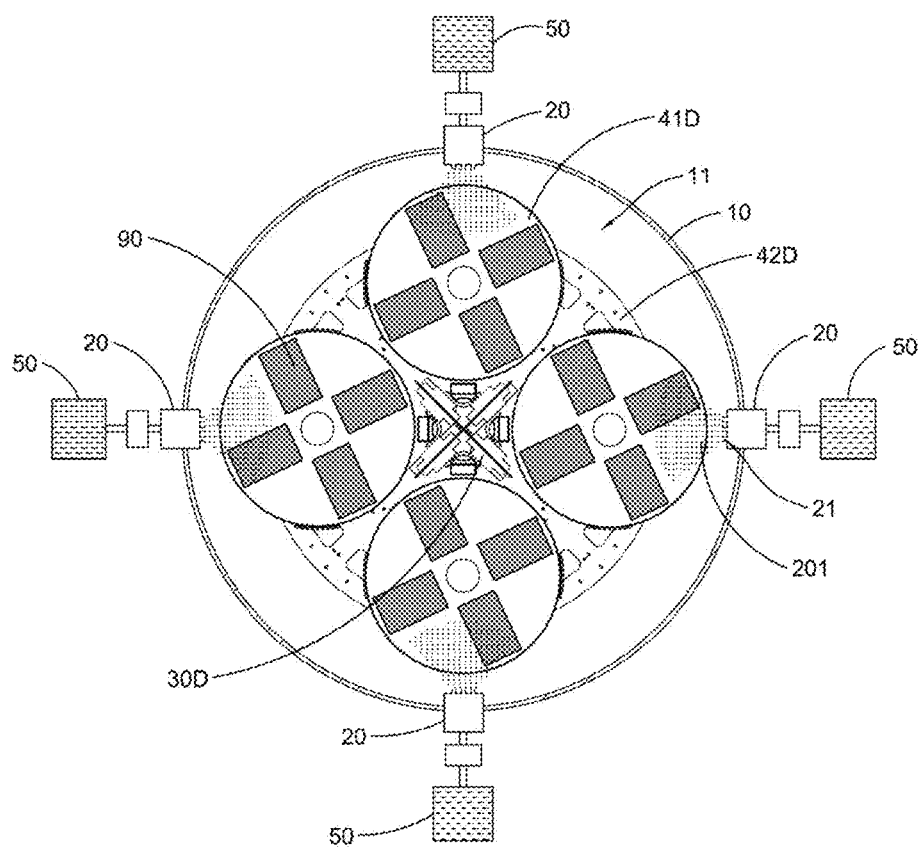
FIG. 15 is a schematic view illustrating the movement of the substrates supported on the movable supporting rack of the coating apparatus according to the above fourth preferred embodiment of the present invention.
Figure 16:
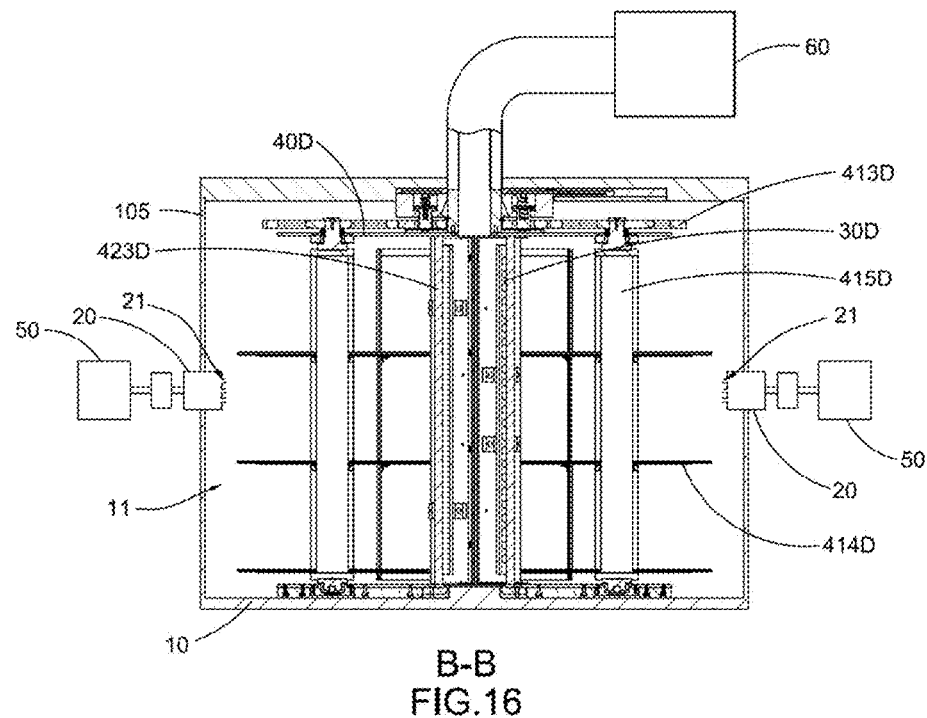
FIG. 16 is a sectional view along line A-A of FIG. 14.
Figure 17:
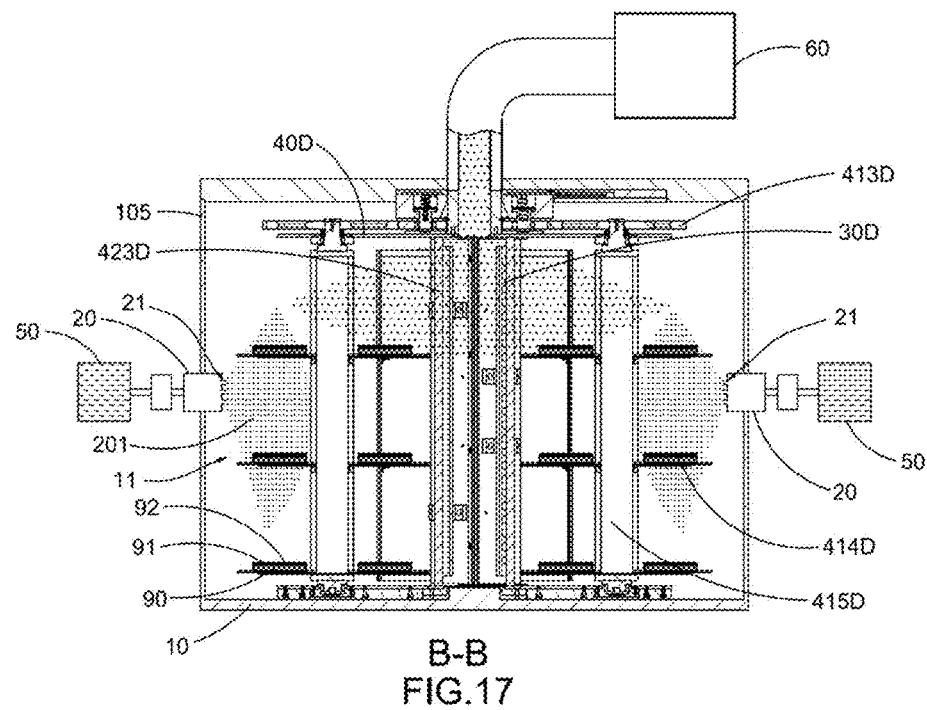
FIG. 17 is a sectional view along line B-B of FIG. 15.

As shown in FIG. 13 of the drawings, the electrical connecting element 82 comprises a first electrical connecting member 821 electrically connected to one of the first electrodes 311D and a second electrical connecting member 822 electrically connecting the first electrically connecting member 821 to the electrical power source 81. The second electrical connecting member 822 is fixed to the chamber body 10, the first electrical connecting member 821 is able to move along with the movable rack 42D when the movable rack 42D is driven to rotate.

Accordingly, the first electrical connecting member 821 is electrically connected to the second electrical connecting member 822 in such a manner that the first electrical connecting member 821 is movable respect to the second electrical connecting member 822. More specifically, when the movable rack 42D is driven to rotate, the first electrical connecting member 821 is rotating with respect to the second electrically connecting member 822. The electrical power source 81 at an outer side of the chamber body 10 is able to supply electrical power to the rotating first electrical connecting member 821.

A connecting end portion of the first electrical connecting member 821 can be embodied as a plate which is biased by a connecting end portion 8221 of the second electrical connecting member 822, an area of the plate is larger than an area of the connecting end portion 8221 of the second electrical connecting member 822. When the first electrical connecting member 821 is rotating along with the movable rack 42D, the connecting end portion 8221 of the second electrical connecting member 822 is kept to be attached on the connecting end portion of the first electrical connecting member 821, so as to ensure the electrical connection between the first electrical connecting member 821 and the second electrical connecting member 822.

Alternatively, the connecting end portion of the first electrical connecting member 821 can be embodied as an electrical sleeve which is sleeved around the connecting end portion 8221 of the second electrical connecting member 822, or the connecting end portion 8221 of the second electrical connecting member 822 can be embodied as an electrical sleeve which is sleeved around the connecting end portion of the first electrical connecting member 821.

The second electrical connecting member 822 can be movably connected to the chamber body 10 and is grounded. Alternatively, the second electrical connection member 822 can be connected or integrally extended from the movable rack 42D which is grounded.

When there are a plurality of first and second electrodes 311D and 312D, all of the first electrodes 311D can be electrically connected with each other, so that when one of the first electrodes 311D is electrically connected to the first electrical connecting member 821, all of the first electrodes 311D can be electrically connected to the electrical power source 81. All of the second electrodes 312D also can be electrically connected with each other to form an integral second electrode.

As shown in the drawings, the coating apparatus further comprises an actuator member 425D which is mounted to the top frame 421D. The actuator member 425D can be driven to rotate, so as to drive the movable rack 42D to rotate. It is worth mention that one more actuator member 425D can also be mounted to the bottom frame 422D for driving the movable rack 42D to rotate.

The actuator member 425D comprises a mounting member 4251D mounted to the top frame 421D and an actuator shaft 4252D extended from the mounting member 4251D, the retention gear 424D has a central hole 4241D for the actuator shaft 4252D to pass therethrough and a retention hole 4242D for the connecting end portion 8221 of the second electrical connecting member 822 to pass therethrough, so that when the movable rack 42D is rotating, the retention gear 424D will also rotate, but the connecting end portion 8221 of the second electrical connecting member 822 penetrates through the retention gear 424D will block the movement of the retention gear 424D, the rotation gears 413D which are engaged with the retention gear 424D will rotate with respect to the retention gear 424D, so as to produce a relative movement between each of the carrier racks 41D and the movable rack 42D, so that an relative movement between each of the plurality of substrates 90 and the movable rack 42D is provided, and thus a relative movement between each of the plurality of substrates 90 and the plasma generation source 30D which is at the center of the movable rack 42D is also provided. Therefore, the plurality of substrates 90 are exposed in the reaction chamber 11 with a relatively even mixture of the monomer and the reactive precursor species, so as to enhance the uniformity and quality of the polymer coatings 92 formed on the surfaces 91 of the plurality of the substrates 90.

Similarly, the coating apparatus may further comprise other components, such as the monomer supply unit 50 for supplying the coating forming material 201 to the monomer discharge source 20, the pressure adjustment unit 60 which is adjacent to the plasma generation source 30D and remotely from the monomer discharge source 20 for adjusting a pressure in the reaction chamber 11 of the chamber body 10, the control unit for controlling the operation of the coating apparatus, and the tail gas tube for collecting a tail gas.

Accordingly, the present invention further provides a coating method for coating a plurality of substrates 90, wherein the coating method comprises the following steps.

(i) Support the plurality of substrates 90 on the supporting rack 40D around the plasma generation source 30D which is provided at a central area 111 within the reaction chamber 11 of the chamber body 10.

(ii) Discharge the coating forming material 201 into the reaction chamber 11 of the chamber body 10 through the monomer discharge source 20 and activate the plasma generation source 30D to plasma processing the plurality of substrates 90.

Accordingly, in the Step (i), the method may further comprise a step of arranging the plurality of substrates between the monomer discharge source 20 and the plasma generation source 30D.

In the step (ii), the method may further comprise the steps of rotating the movable rack 42D about a central axis X thereof, rotating a plurality of carrier racks 41D for supporting the plurality of substrates about a central axis Y, and radially discharging the coating forming material 201 through a plurality of the monomer discharge sources 20 towards said plasma generation source 30D at the central area 111 within the reaction chamber 11 of the chamber body 10.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and are subject to change without departure from such principles. Therefore, this invention includes all modifications encompassed within the spirit and scope of the following claims.

What is claimed is:

1. A coating apparatus for coating a plurality of substrates, comprising:
    a chamber body having a reaction chamber;
    a monomer discharge source having a discharge inlet for introducing a coating forming material into said reaction chamber of said chamber body;
    a plasma generation source disposed at a central area of said reaction chamber of said chamber body for exciting the coating forming material; and
    a supporting rack for supporting the plurality of substrates around said plasma generation source within said chamber body;
    wherein said supporting rack comprises a movable rack which is operable to rotate about a central axis of said movable rack and a carrier rack for supporting the plurality of substrates, wherein said carrier rack is arranged on said movable rack and is operable to rotate about a central axis of said carrier rack around said plasma generation source;
    wherein said movable rack comprises a top frame, a bottom frame, and a plurality of connectors extended between said top frame and said bottom frame, wherein said supporting rack comprises a plurality of said carrier racks supported between said top frame and said bottom frame; and
    wherein said supporting rack is adapted for supporting the plurality of substrates between said monomer discharge source and said plasma generation source.

2. The coating apparatus, as recited in claim 1, wherein said carrier rack comprises a supporting arm, two retention arms extended from two ends of said supporting arm respectively, and one or more supporting seats extended between said two retention arms for supporting the plurality of substrates.

3. The coating apparatus, as recited in claim 1, wherein each of said carrier racks further comprises a retention gear supported on said top frame, wherein each of said carrier racks comprises a rotation gear which is engaged with said retention gear.

4. The coating apparatus, as recited in claim 3, wherein each of said carrier racks comprises a supporting arm, two retention arms extended from said supporting arms respectively, and a plurality of supporting seats extended between said two retention arms for supporting the plurality of substrates, wherein said rotation gear is mounted on a top of said supporting arm.

5. The coating apparatus, as recited in claim 1, wherein said plasma generation source comprises a first electrode and a second electrode functioning as a pair of opposite electrodes for applying an electric power to the coating forming material discharged into said reaction chamber, wherein said coating apparatus further comprises a power supply arrangement which comprises an electrical power source and an electrical connecting element for electrically connecting said first electrode to said electrical power source.

6. The coating apparatus, as recited in claim 5, wherein said electrical connecting element comprises a first electrical connecting member electrically connected to said first electrode and a second electrical connecting member connected to said electrical power source, wherein said first electrical connecting member is rotatably and electrically coupled with said second electrical connecting member.

7. The coating apparatus, as recited in claim 3, wherein said plasma generation source comprise a first electrode and a second electrode functioning as a pair of opposite electrodes for applying an electric power to the coating forming material discharged into said reaction chamber, wherein said coating apparatus further comprises a power supply arrangement which comprises an electrical power source and an electrical connecting element for electrically connecting said first electrode to said electrical power source.

8. The coating apparatus, as recited in claim 7, wherein said electrical connecting element comprises a first electrical connecting member electrically connected to said first electrode and a second electrical connecting member connected to said electrical power source, wherein said first electrical connecting member is rotatably and electrically coupled with said second electrical connecting member.

9. The coating apparatus, as recited in claim 8, wherein said second electrical connecting member has a connecting end portion penetrating through said retention gear to block a rotation movement of said retention gear, wherein said rotation gear which is engaged with said retention gear is capable of rotating with respect to said retention gear, so as to produce a relative movement between each of said carrier racks and said movable rack.

10. The coating apparatus, as recited in claim 9, wherein said movable rack further comprises an actuator member which is mounted to said top frame for being actuated to drive said movable rack to rotate, wherein said actuator member comprises a mounting member mounted to said top frame and an actuator shaft extended from said mounting member, wherein said retention gear has a central hole for said actuator shaft to pass therethrough and a retention hole for said connecting end portion of said second electrical connecting member to pass therethrough.

11. The coating apparatus, as recited in claim 1, wherein said chamber body has an inner wall, wherein said coating apparatus comprises a plurality of said monomer discharge sources provided adjacent to said inner wall for radially dispersing the coating forming material into said reaction chamber.

12. The coating apparatus, as recited in claim 1, wherein an electrical discharge manner of said plasma generation source is selected from the group consisting of a direct current discharge, an alternating current discharge, an audio frequency discharge, a radio frequency discharge, a microwave discharge, a medium frequency discharge, a penning discharge, a spark discharge and a pulse discharge.

13. The coating apparatus, as recited in claim 1, wherein said coating apparatus further comprise a monomer supply unit which comprises a material storage member for storing a raw material of the coating forming material, a vaporizer for vaporizing the raw material to form the coating forming material which is a monomer vapor.

14. The coating apparatus, as recited in claim 1, wherein said coating apparatus further comprise a monomer supply unit which comprises a material storage member, which is communicated to said monomer discharge source, for storing the coating forming material which is a gaseous monomer.

* * * * *